United States Patent
Verrax et al.

(10) Patent No.: US 12,117,479 B2
(45) Date of Patent: Oct. 15, 2024

(54) TRANSIENT BASED METHOD FOR IDENTIFYING FAULTS IN A HIGH / MEDIUM VOLTAGE ELECTRIC POWER TRANSMISSION SYSTEM

(71) Applicants: SUPERGRID INSTITUTE, Villeurbanne (FR); UNIVERSITE DE PARIS XI PARIS SUD, Orsay (FR); UNIVERSITE GRENOBLE ALPES, Saint Martin D'heres (FR)

(72) Inventors: Paul Verrax, Lyons (FR); Alberto Bertinato, Lyons (FR); Michel Kieffer, Lyons (FR); Bertrand Raison, Lyons (FR); Nathan Alglave, Lyons (FR)

(73) Assignees: SUPERGRID INSTITUTE, Villeurbanne (FR); UNIVERSITE DE PARIS XI PARIS SUD, Orsay (FR); UNIVERSITE GRENOBLE ALPES, Saint Martin d'heres (FR)

( * ) Notice: Subject to any disclaimer, the term of this patent is extended or adjusted under 35 U.S.C. 154(b) by 365 days.

(21) Appl. No.: 17/604,823

(22) PCT Filed: Apr. 16, 2020

(86) PCT No.: PCT/EP2020/060775
§ 371 (c)(1),
(2) Date: Oct. 19, 2021

(87) PCT Pub. No.: WO2020/212533
PCT Pub. Date: Oct. 22, 2020

(65) Prior Publication Data
US 2022/0206055 A1 Jun. 30, 2022

(30) Foreign Application Priority Data
Apr. 19, 2019 (EP) .................................... 19305517

(51) Int. Cl.
*G01R 31/08* (2020.01)
*H02H 7/26* (2006.01)
(Continued)

(52) U.S. Cl.
CPC ......... *G01R 31/086* (2013.01); *G01R 31/083* (2013.01); *G01R 31/085* (2013.01);
(Continued)

(58) Field of Classification Search
CPC .. G01R 31/086; G01R 31/083; G01R 31/085; Y02E 60/60; Y04S 10/20; Y04S 10/30;
(Continued)

(56) References Cited

U.S. PATENT DOCUMENTS

2010/0277181 A1* 11/2010 Saha .................... G01R 31/088
324/521
2015/0081235 A1* 3/2015 Schweitzer, III ...... G01R 31/11
702/59
(Continued)

FOREIGN PATENT DOCUMENTS

CN 108693444 A 10/2018
WO 2014053174 A1 4/2014
(Continued)

OTHER PUBLICATIONS

Edward C. Chang et al., "Transient Simulation of Lossy Coupled Transmission Lines Using Iterative Linear Least Square Fitting and Piecewise Recursive Convolution," IEEE Transactions on Circuits and Systems Part I: Regular Papers, vol. 43, No. 11, Nov. 1, 1996.
(Continued)

*Primary Examiner* — Farhana A Hoque
*Assistant Examiner* — Joseph O Nyamogo
(74) *Attorney, Agent, or Firm* — Occhiuti & Rohlicek LLP

(57) ABSTRACT

The invention relates to a transient based method for identifying faults in an electric power transmission and/or dis-
(Continued)

Figure 1:
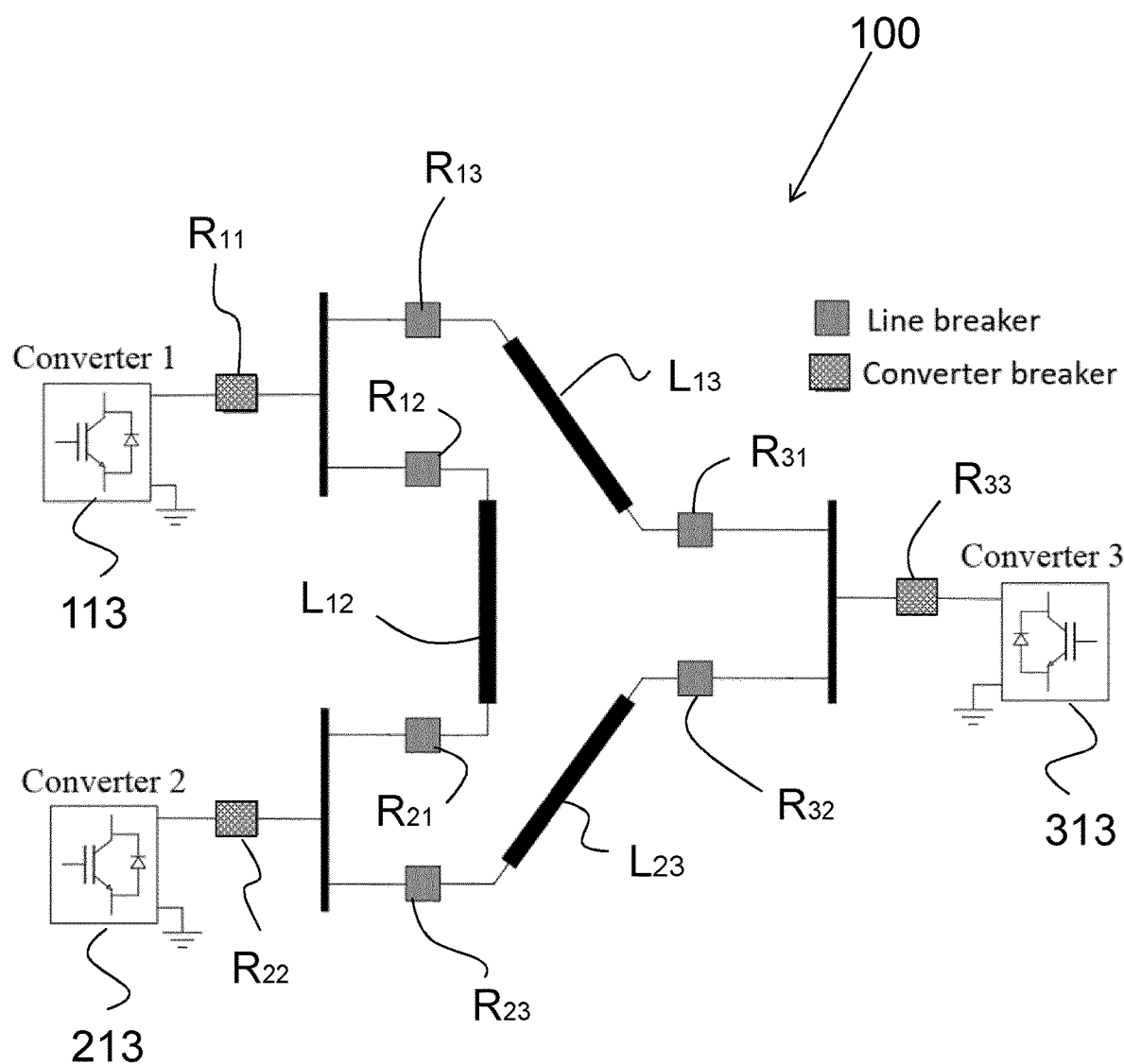

tribution system (100) having at least one current transmission line ($L_{12}$, $L_{13}$, $L_{23}$) comprising the following steps: —generation of a physical model of the at least one current transmission line ($L_{12}$, $L_{13}$, $L_{23}$), the physical model depending on the fault parameters and describing the behavior of voltage and/or current transients due to the fault in the at least one current transmission line, fault parameters comprising a fault location parameter on said current transmission line ($L_{12}$, $L_{13}$, $L_{23}$) and a fault impedance parameter, —measurement of voltage and/or currents evolution at least at one specific location in the said power system (100), —iterative simulation of the voltage and/or current evolution by the physical model at the measurement point with a set of fault parameters where at each step of iteration, simulated and measured voltage and/or current evolutions are compared and the set of fault parameters is adapted according to a convergence criterion, —identification of a fault with its fault parameters when convergence of the measured voltage and/or current evolutions and simulated voltage and/or current evolutions is reached in a limited number of iterations.

18 Claims, 15 Drawing Sheets

(51) Int. Cl.
*H02J 3/36* (2006.01)
*H02J 13/00* (2006.01)

(52) U.S. Cl.
CPC ....... *H02H 7/268* (2013.01); *H02J 13/00002* (2020.01); *H02J 3/36* (2013.01); *Y02E 60/60* (2013.01); *Y04S 10/20* (2013.01); *Y04S 10/30* (2013.01)

(58) Field of Classification Search
CPC ...... H02J 13/00002; H02J 3/36; H02H 7/268; H02H 7/265
See application file for complete search history.

(56) References Cited

U.S. PATENT DOCUMENTS

2016/0349305 A1* 12/2016 Pal ......................... G01R 31/52
2017/0199237 A1* 7/2017 Dzienis ................ G01R 31/088

FOREIGN PATENT DOCUMENTS

WO 2015039113 A1 3/2015
WO WO-2015139719 A1 * 9/2015 ............. H02H 3/305

OTHER PUBLICATIONS

International Search Report for PCT Application No. PCT/EP2020/060775, mailed Jun. 2, 2020 (4 pages).

* cited by examiner

TRANSIENT BASED METHOD FOR IDENTIFYING FAULTS IN A HIGH / MEDIUM VOLTAGE ELECTRIC POWER TRANSMISSION SYSTEM

CROSS REFERENCE TO RELATED APPLICATIONS

This application is a National Stage of International Application No. PCT/EP2020/060775 filed on Apr. 16, 2020, which claims priority to European Application No. 19305517.5 filed on Apr. 19, 2019, the contents of which are hereby incorporated by reference in their entirety.

FIELD OF THE INVENTION

The invention relates in general to high and medium voltage electric power transmission and/or distribution system, and more specifically to fault protection of transmission and/or distribution lines comprised in an electric power transmission and/or distribution system.

In particular, the invention relates to a method for identifying faults in high or medium voltage DC or AC grids and a related device for identifying faults in high or medium voltage DC or AC grids.

BACKGROUND AND PRIOR ART

Electrical power transmission and in particular HVDC power transmission is becoming more and more important in particular because of the steadily rising need for bulk power delivery and power grid interconnections.

One attractive feature of HVDC transmission recognized is also that the direction of power transmission can be chosen by changing the direction of current.

The introduction of Multi-Terminal high voltage Direct Current (MTDC) grids has recently been the subject of many studies. In the future, such a grid would act as a backbone to the existing AC network, providing better interconnection over large distances between renewable energy sources and consumption area as well as integration of large offshore wind power plants. Among several technical and non-technical barriers still to overcome for the development of HVDC meshed grids, the protection of the lines is seen as one of the most challenging. The differences from the High Voltage Alternative Current (HVAC) case require the development of new solutions, both regarding the breaker technologies and the protection strategies.

The main tasks of a protection strategy include fault detection, faulty component identification and tripping of the breakers. Analysis of the fault such as precise fault location can generally be performed post mortem, i.e. after the fault is cleared. If the breakers are triggered before the faulty component is identified so that a large part of the grid is deenergized, one refers to as a non-selective fault clearing strategy. On the opposite, selective fault clearing strategy consist in identifying the faulty component so that only the corresponding breakers are triggered, which is considered preferable since it minimizes the impact of the fault on the grid. In such a strategy, breaking modules located at the end of each line are responsible for the protection of their respective line.

Overall, the protection strategy must act if and only if actions are needed and for instance must be immune to changes caused by normal operations, which is referred to as reliability. Finally, the protection algorithm must operate fast enough to cope with Direct Current Circuit Breaker (DCCB) capabilities, e.g., in less than a millisecond, which makes use of telecommunication not suitable. More specifically, each relay can only use measurements from the voltage and current sensors placed at the same location as the relay. Hence selective protection scheme requires a single ended (non-unit) algorithm ensuring selectivity, i.e., able to discriminate between internal faults, occurring on the protected line and external faults, occurring elsewhere in the grid.

In this technical field, EP3062185 discloses a method and a protective system for monitoring an electrical system having at least one measuring station, in particular a high-voltage direct current transmission system, comprising the following steps:

for the respective measuring station by means of memory devices storing models of the system describing a respective state of the system in a respective estimating device, integrated in an estimating bank;

applying the respective estimator bank by comparing values measured by the respective measuring station with values of a respective model;

determining the model with the smallest difference between the currently measured values and the own model-specific values, whereby the particular model indicates the current state of the system.

One drawback of the proposed solution is that the models used do not depend explicitly upon the physical characteristics of the grid and cannot be adapted if such characteristics were to change. In addition, for every fault, a specific model must be created which could lead to a non-detection of a fault if such model was not created in the data base in advance.

Therefore one object of the present invention is to improve fault detection and identification with respect to the prior art.

To this extent, the present invention proposes a transient based method for identifying faults in an electric power transmission and/or distribution system having at least one current transmission line comprising the following steps:

generation of a physical model of the at least one current transmission line, the physical model depending on the fault parameters and describing the behavior of voltage and/or current transients due to the fault in the at least one current transmission line, fault parameters comprising a fault location parameter on said current transmission line and a fault impedance parameter, measurement of voltage and/or currents evolution at least at one specific location in the said power system, iterative simulation of the voltage and/or current evolution by the physical model at the measurement point with a set of fault parameters where at each step of iteration, simulated and measured voltage and/or current evolutions are compared and the set of fault parameters is adapted according to a convergence criterion, identification of a fault with its fault parameters when convergence of the measured voltage and/or current evolutions and simulated voltage and/or current evolutions is reached in a limited number of iterations.

One advantage is that only one physical model can be used irrespective of the fault that may appear. In addition, as a physical model is used, after convergence, the fault can be interpreted and allows a better understanding what has happened. In particular in a HVDC grid with several current transmission lines, the physical model to be used can be the same at all locations, only the related constants for example for length, resistivity etc. of the related current transmission line need to be adjusted for example by calculations or by calibrations. Additionally, existing identification methods assume the presence of rather large inductances at the end of each line in the grid. Such inductances are used to limit the rise of current and distinguish between faults occurring on different lines. The present methods detect and identify the fault fast enough so that it does not require such inductances. In addition, it is a single location approach, because all measurements taken at one location are treated in an isolated manner and do not rely on measurements form other locations, that are far away, for example at the other terminal of the current transmission line.

The method according to the invention may comprise one or several of the following features taken alone or in combination:

According to one aspect, the physical model is based on telegraph equation for describing the fault parameters and the behavior of travelling waves due to the fault in the said electrical power transmission and/or distribution system.

The physical model may be extended to take into account soil resistivity.

The extension of the physical model for taking into account soil resistivity comprises for example a filtering function.

The electrical power transmission and/or distributor system may be a high or medium voltage DC grid or a high or medium voltage AC grid.

The physical model may take into account modal voltage and current. According to a further aspect, the convergence criterion comprises the minimization of a cost function of the difference of simulated and measured voltage and/or current evolutions.

Identification of a fault comprises for example in addition verification that the obtained fault parameters belong to a predefined validity domain.

In each iteration step, voltage and/or currents evolutions at specific locations in the said electrical power transmission and/or distribution system may be completed with ongoing measurements.

A specific location is for example at an end of a current transmission line and/or a relay and/or a breaker module and/or a station.

The method may be started upon detection of an unusual behavior with respect to a nominal functioning of the electrical power transmission and/or distribution system.

An unusual behavior comprises for example a voltage drop, a current increase, a crossing of a threshold or a combination of thereof.

In case a fault has been identified, the method may comprise a generation of an output in order to activate protection circuits in the said electrical power transmission and/or distribution system.

The invention also relates to a fault identification module for identifying faults in an electrical power transmission and/or distribution system having at least one current transmission line the module being configured for:
memorization of a physical model of the electrical power transmission and/or distribution system with its current transmission line(s), the physical model describing the fault parameters and the behavior of travelling waves due to the fault in the electrical power transmission and/or distribution system in case of a fault, fault parameters comprising a fault location parameter on said current transmission line and a fault impedance parameter,
measurement of voltage and/or currents evolution at least at one specific location in the said power system,
iterative simulation of the voltage and/or current evolution by the physical model at the measurement point with a set of fault parameters where at each step of iteration, simulated and measured voltage and/or current evolutions are compared and the set of fault parameters is adapted according to a convergence criterion,
identification of a fault with its fault parameters when convergence of the measured voltage and/or current evolutions and simulated voltage and/or current evolutions is reached in a limited number of iterations.

The fault identification module may present the following features taken alone or in combination:

The physical model may be based on telegraph equation for describing the fault parameters and the behavior of travelling waves due to the fault in said electrical power transmission and/or distribution system.

The physical model may be extended to take into account soil resistivity.

The extension of the physical model for taking into account soil resistivity comprises for example a filtering function.

The convergence criterion may comprise the minimization of a cost function of the difference of simulated and measured voltage and/or current evolutions.

The fault identification module may be further configured to verify that the obtained fault parameters belong to a predefined validity domain.

The fault identification module may be further configured for completion by ongoing measurements of voltage and currents evolutions at specific locations said electrical power transmission and/or distribution system. The fault identification module may be configured for starting iterative simulation upon detection of an unusual behavior with respect to a nominal functioning of said electrical power transmission and/or distribution system.

An unusual behavior comprises for example a voltage drop, a current increase, a crossing of a threshold or a combination of thereof.

The fault identification module may be further configured to generate an output in order to activate at least one protection circuit in the said electrical power transmission and/or distribution system in case a fault has been identified.

The invention also relates to a high or medium voltage electric power transmission and/or distribution system comprising at least one fault identification module as described above for controlling at least one protection circuit in a high/medium voltage electric power transmission and/or distribution system in case of a fault identification.

The at least one fault identification module is for example disposed at an end of a current transmission line and/or integrated in a relay and/or integrated in a DC breaker module and/or integrated in a MMC station.

The electrical power transmission and/or distributor system is for example a high or medium voltage DC grid or a high or medium voltage AC grid.

BRIEF DESCRIPTIONS OF THE DRAWINGS

Figure 2:
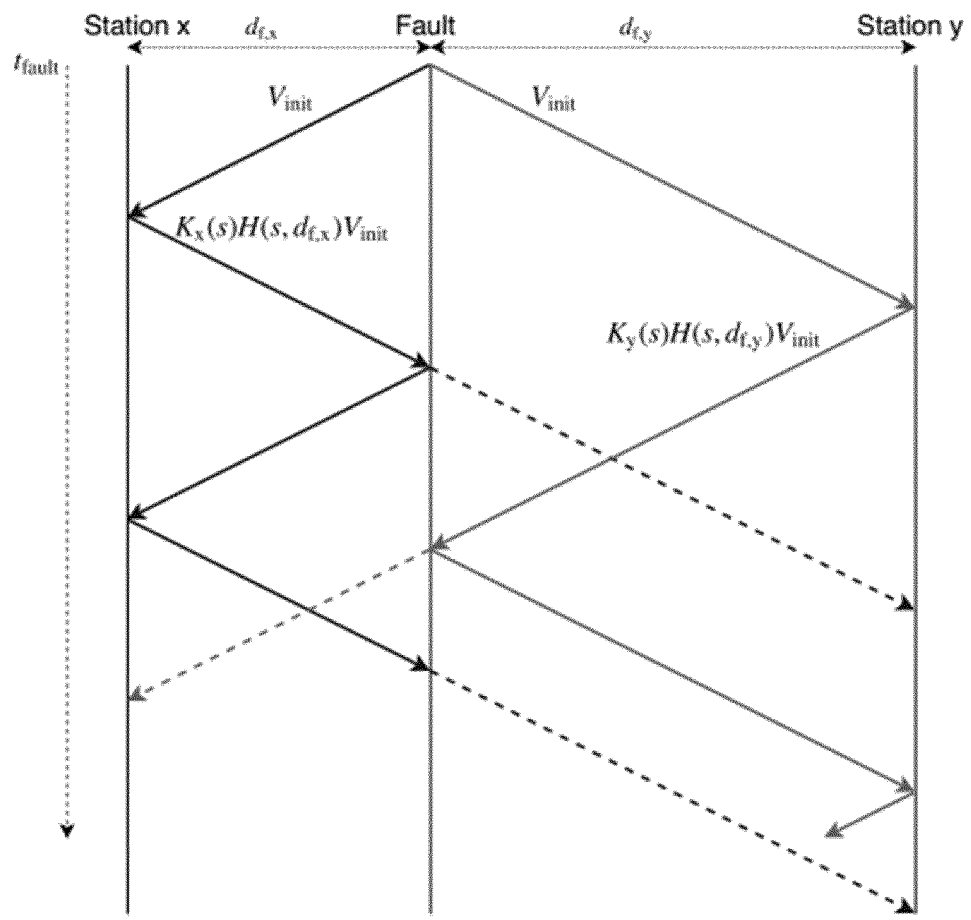
Figure 3:
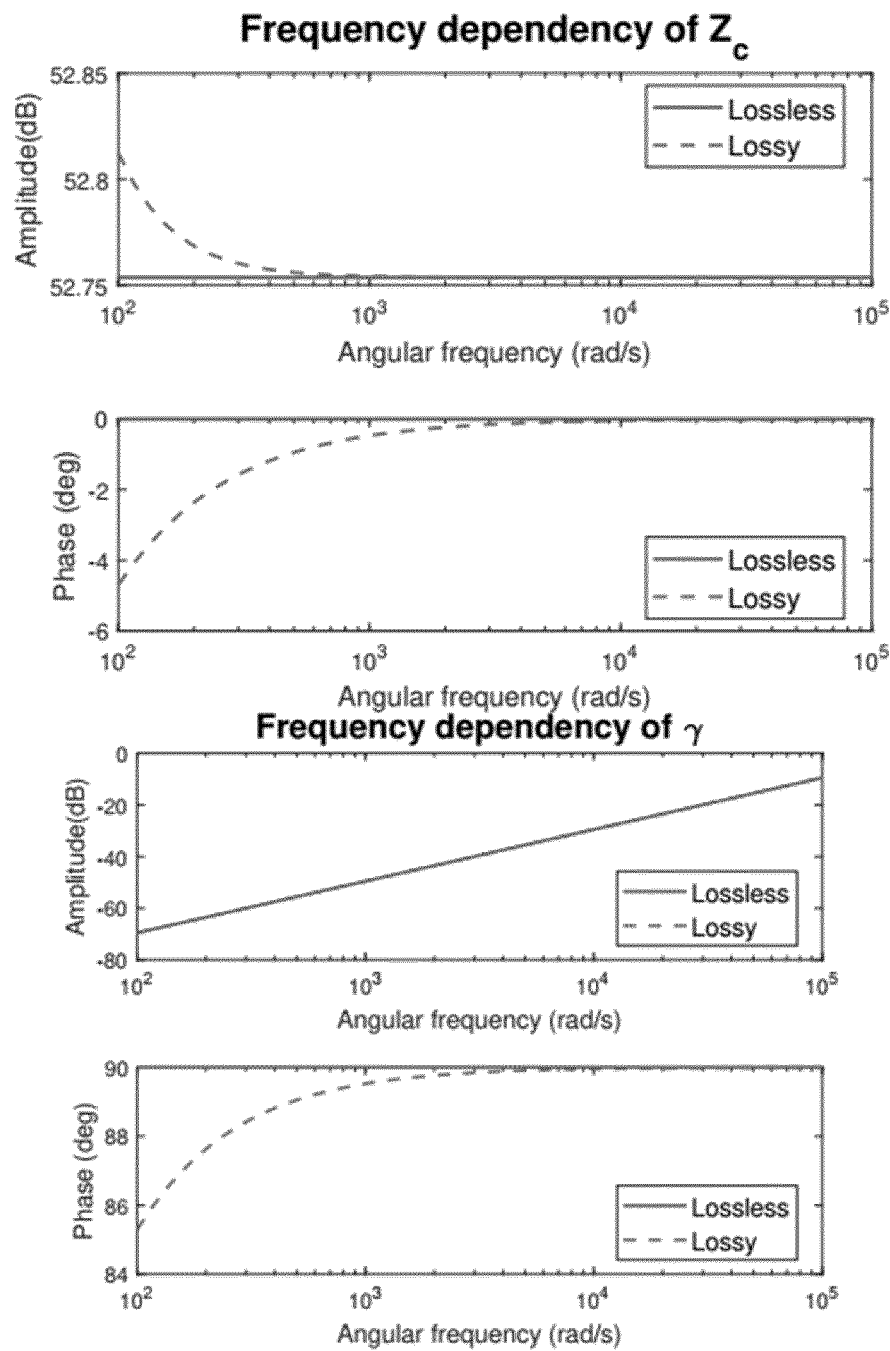
Figure 4:
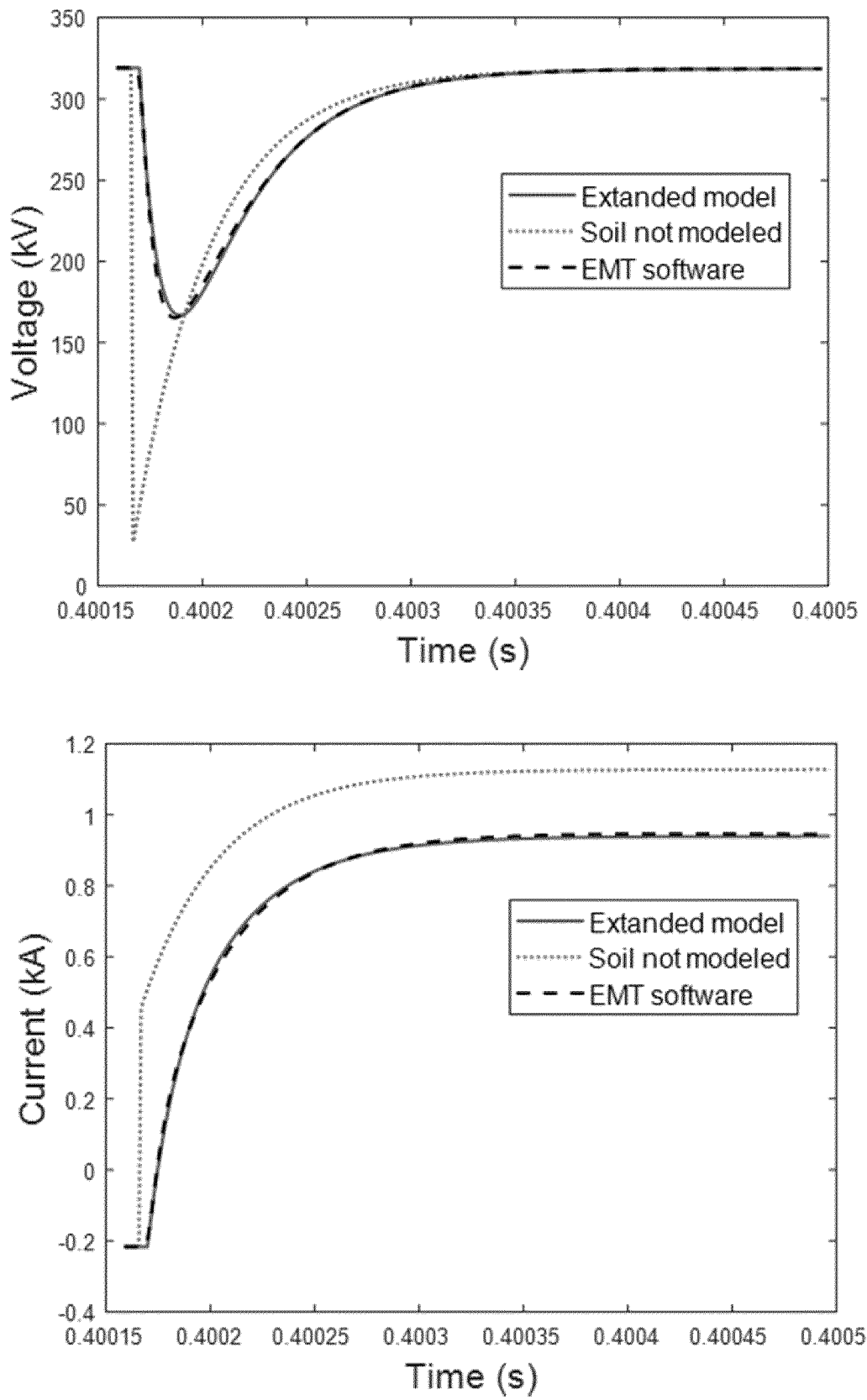
Figure 5:
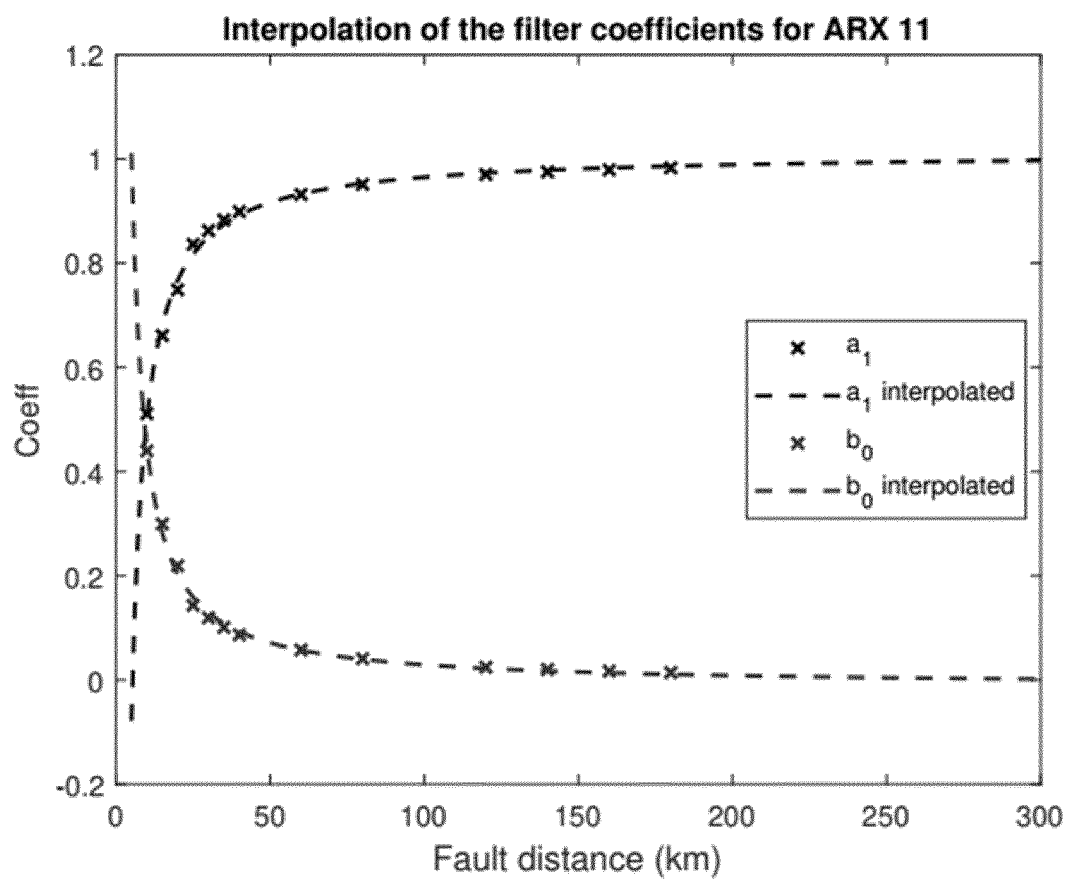
Figure 6:
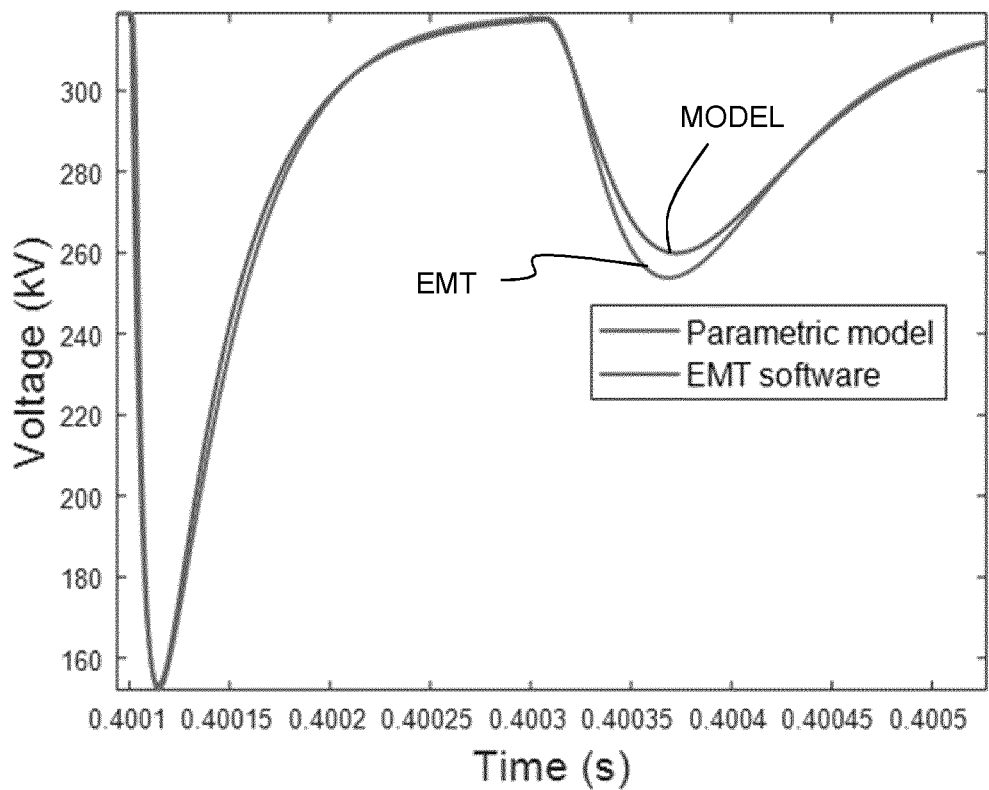
Figure 6:
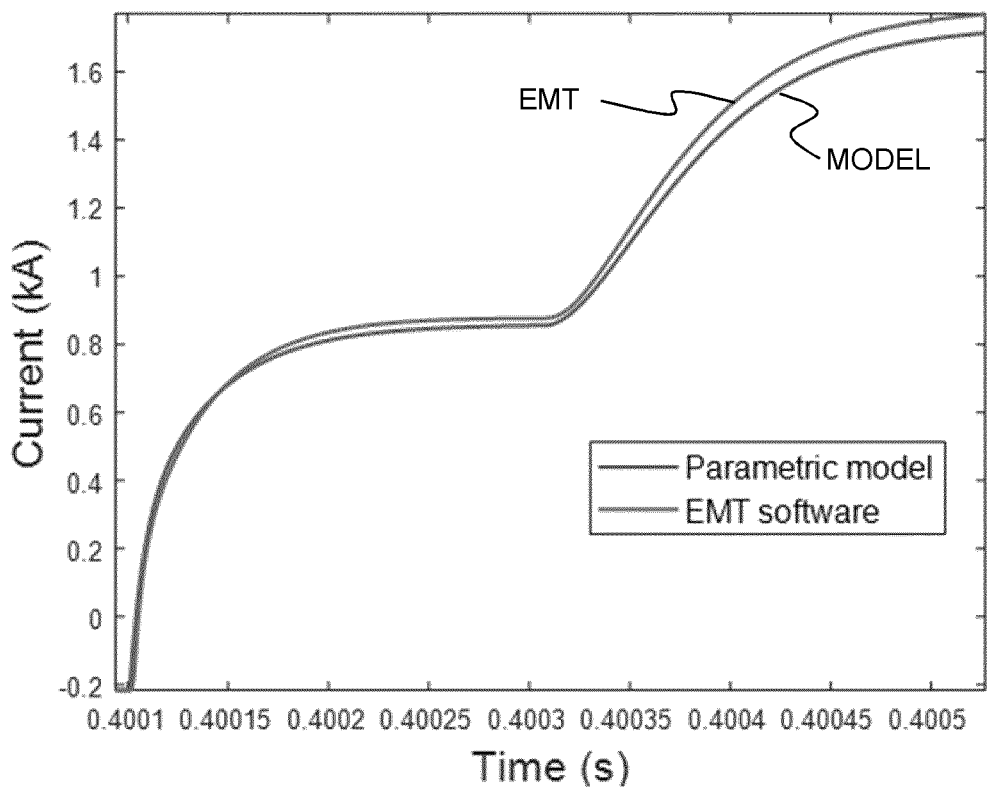
Figure 7A:
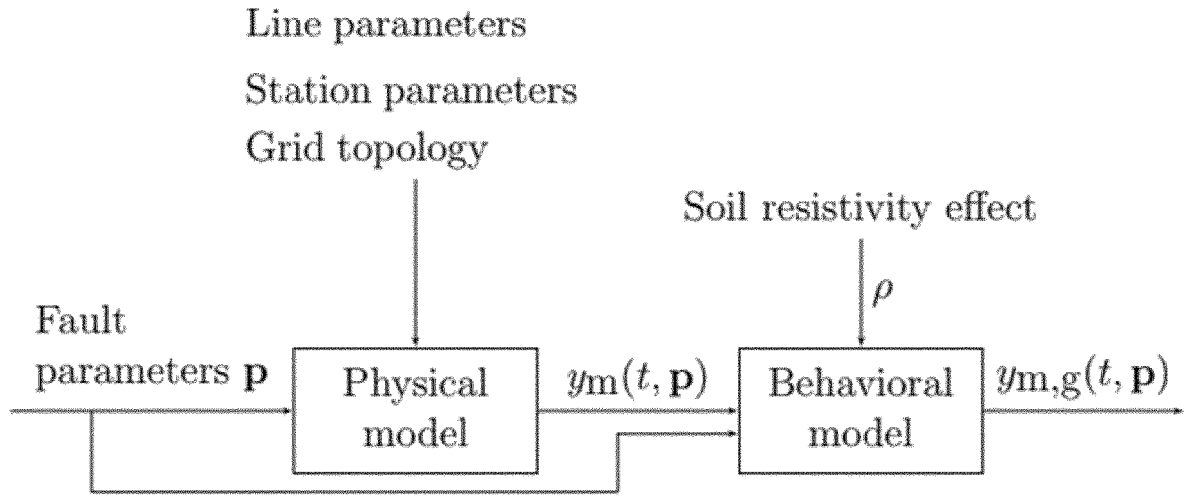
Figure 7B:
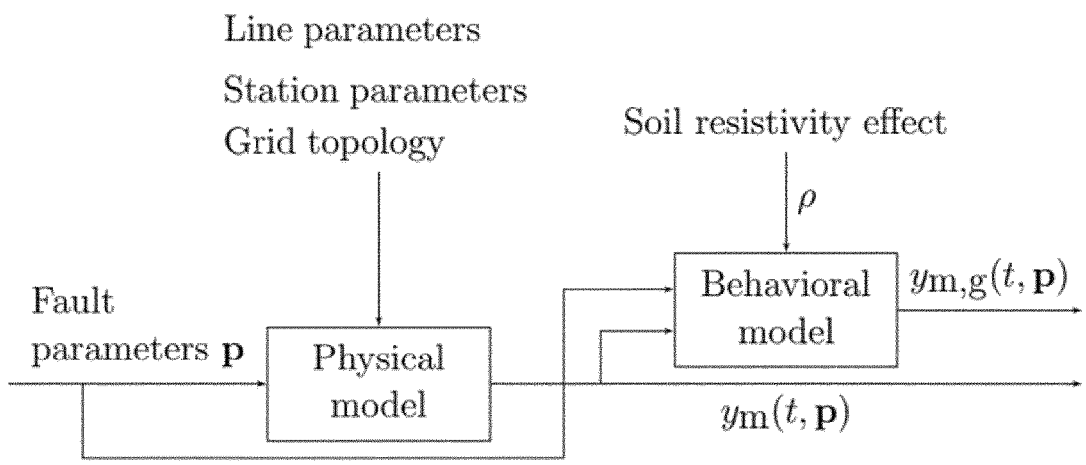
Figure 8:
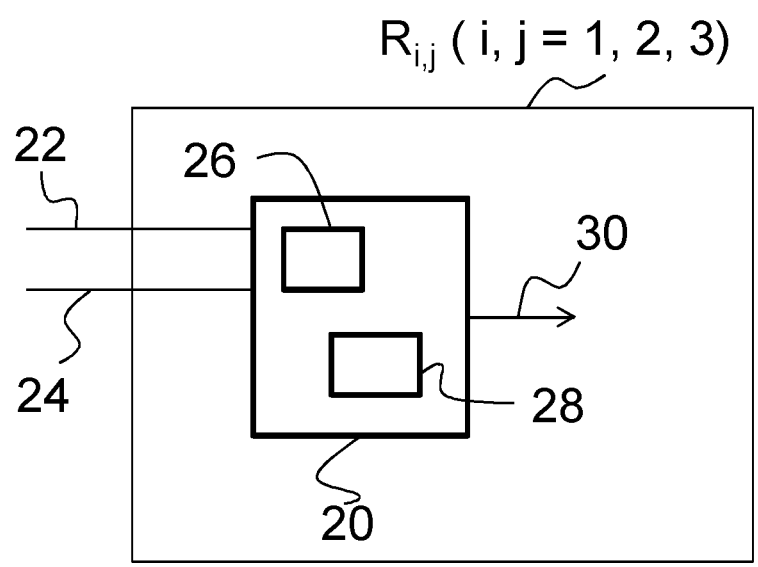
Figure 9A:
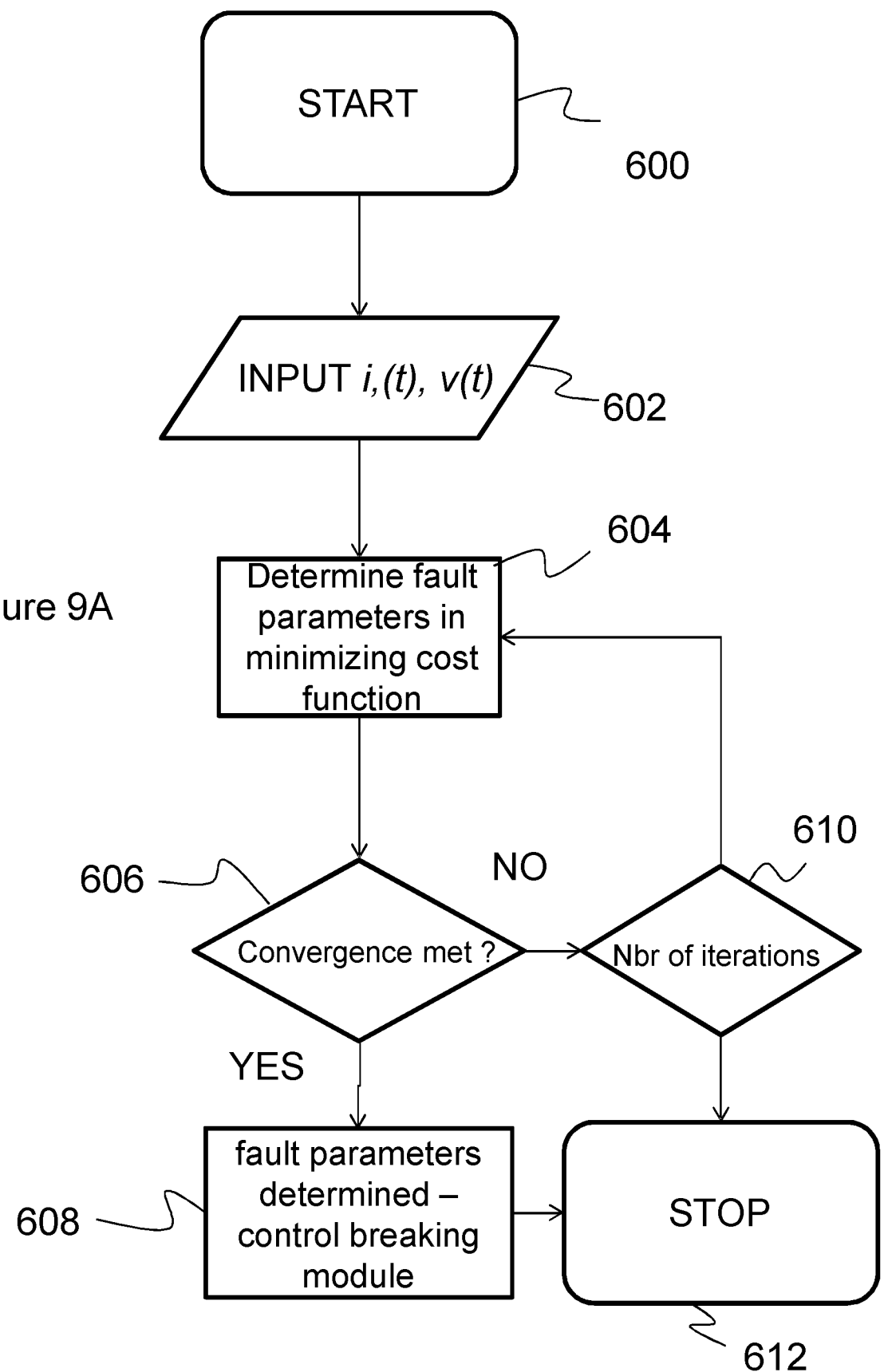
Figure 9B:
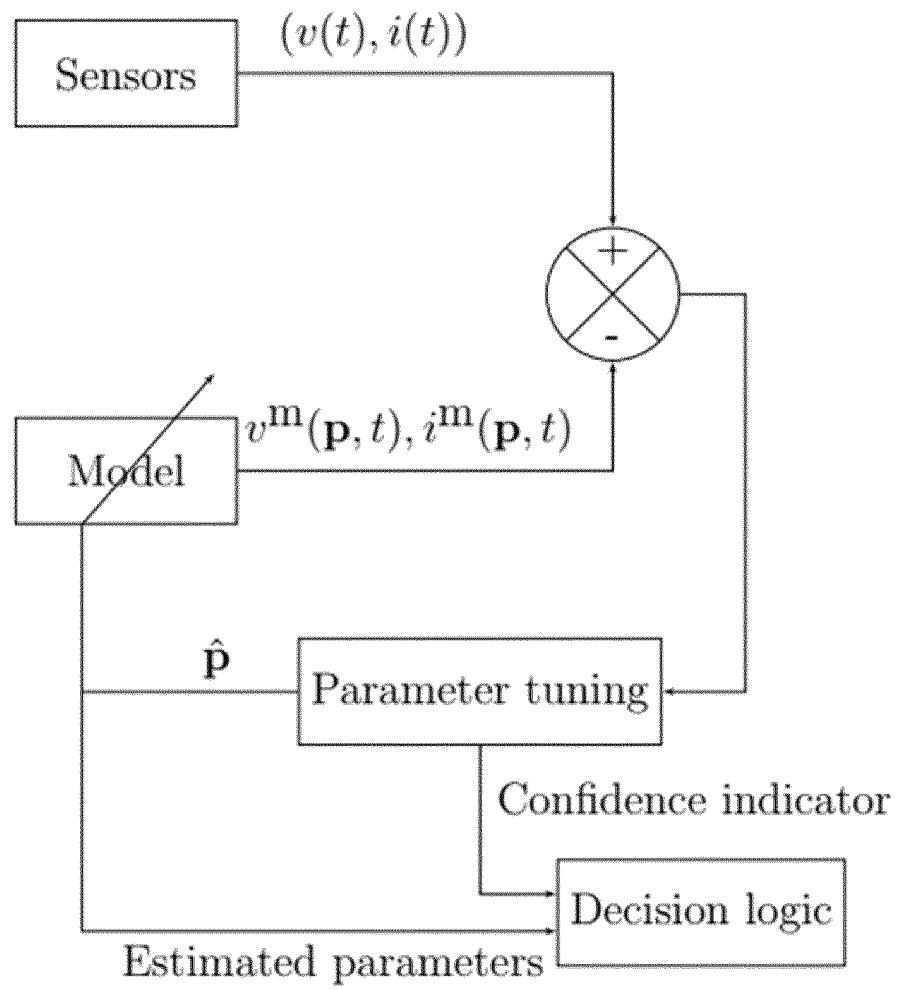
Figure 10:
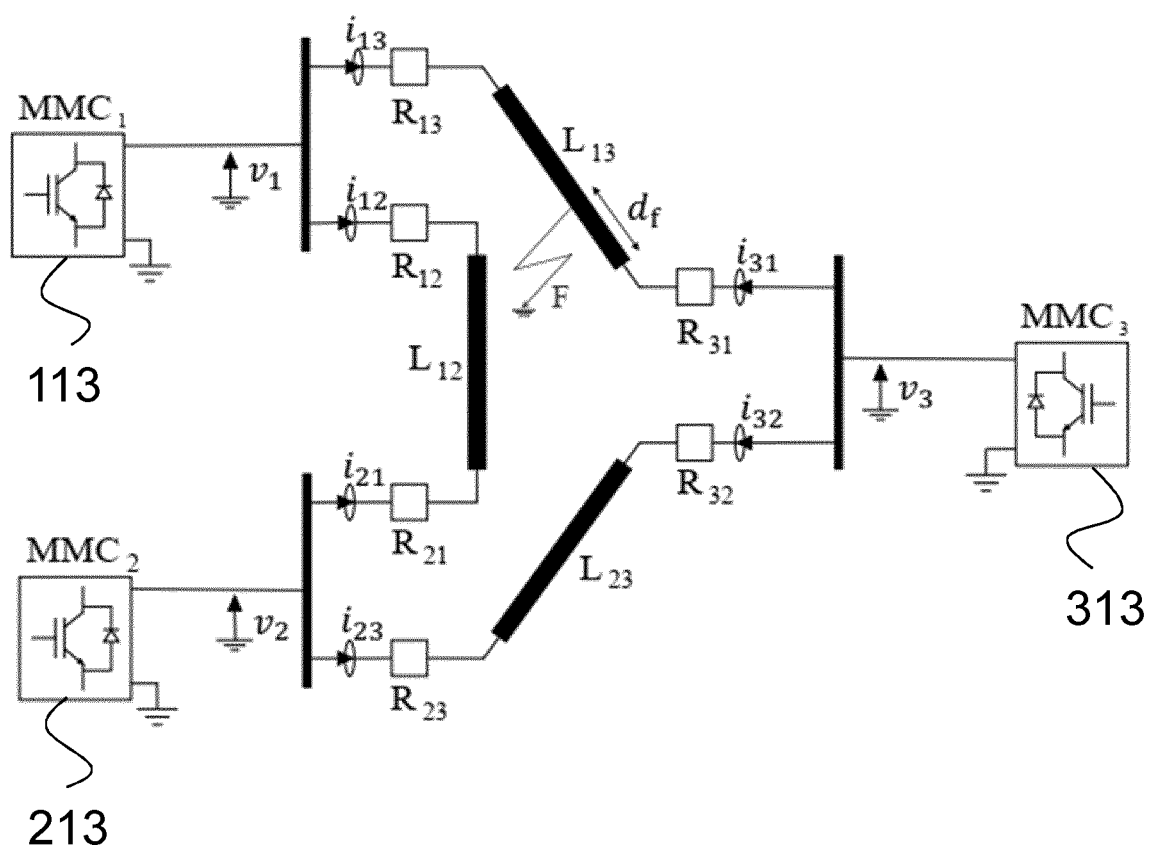
Figure 11:
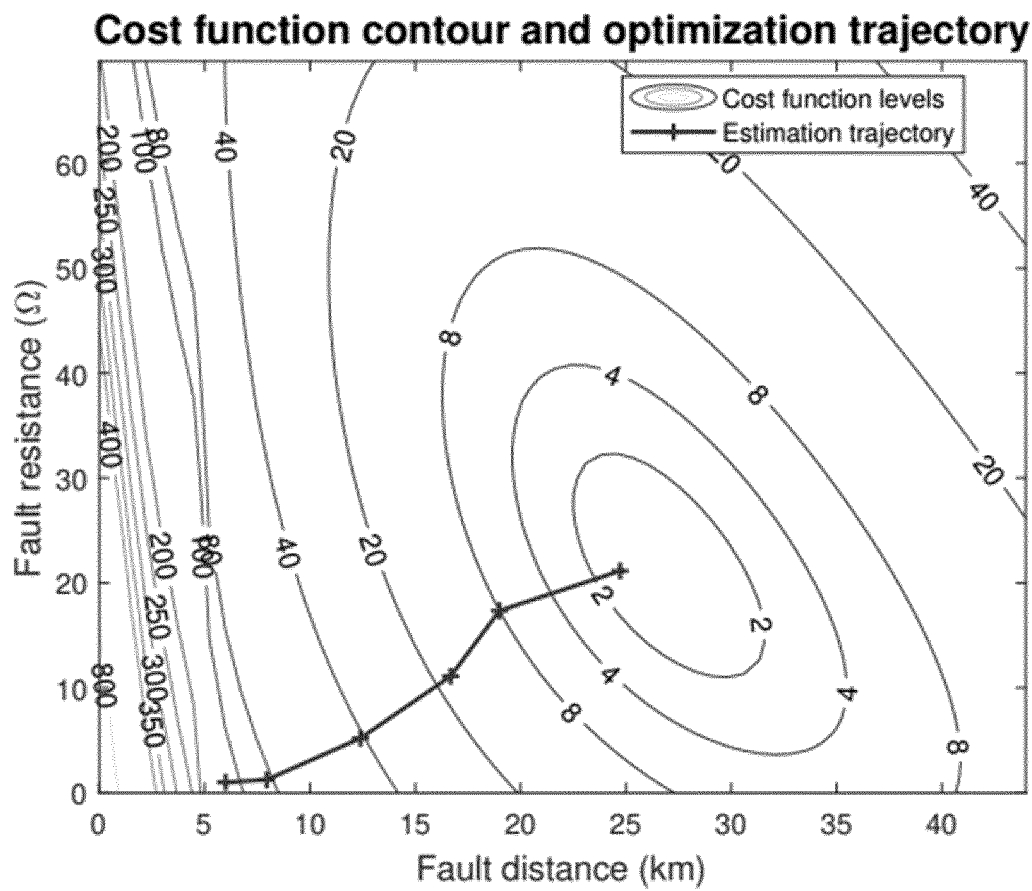
Figure 12:
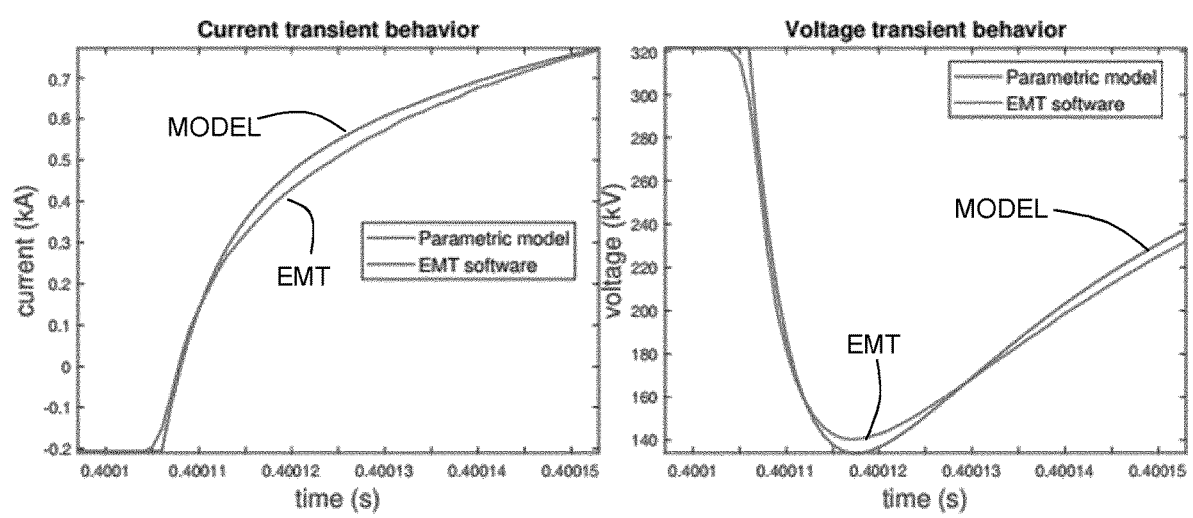
Figure 13:
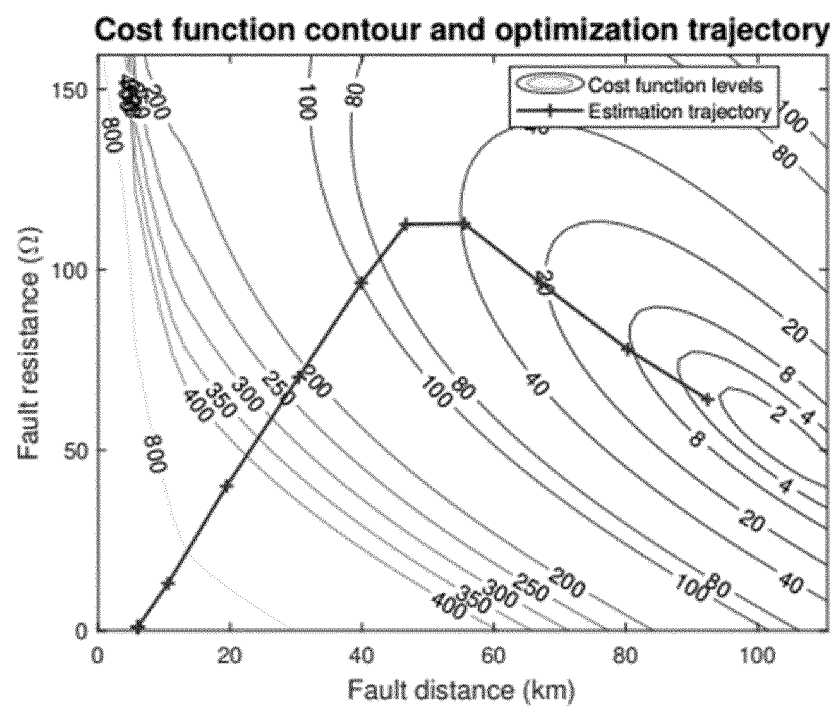
Figure 14:
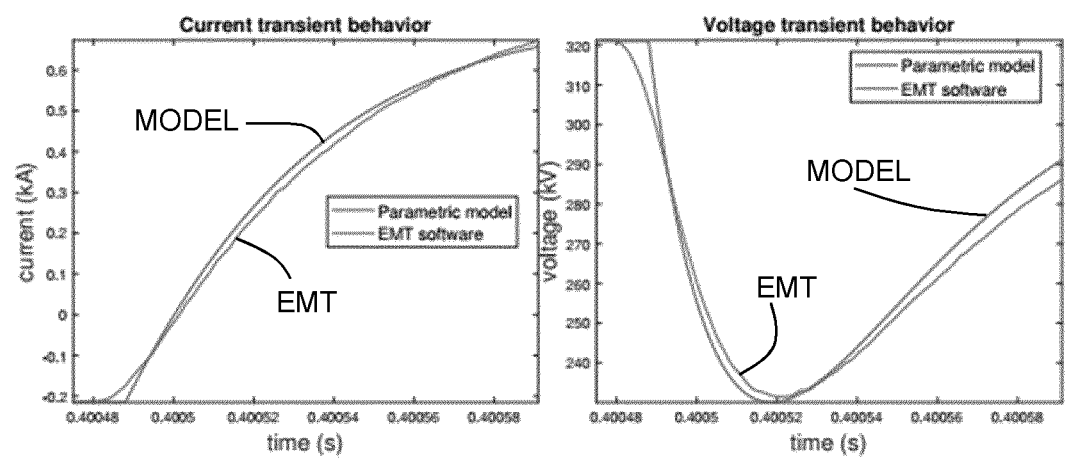

Other advantages and characteristics will appear with the reading of the description of the following figures:

FIG. 1 shows in a synoptic scheme of an example of a three nodes MTDC network,

FIG. 2 shows a Bewley lattice diagram showing the position and direction of motion of every generated, reflected, and transmitted wave caused by a fault on a transmission line, FIG. 3 shows four graphs, first and second graphs from top to bottom show the frequency dependency of the line characteristic impedance $Z_c$ and third and fourth graphs from top to bottom show the frequency dependency of the line propagation constant γ, FIG. 4 shows two graphs modelling voltage and current in function of time for soil resistivity effect modeling using ARX model, FIG. 5 shows a graph filter coefficients in function of fault distance, FIG. 6 shows two graphs modelling voltage and current in function of time for soil resistivity effect modeling using ARX11 model, FIG. 7A shows a synoptic presentation of a first example of an extended physical model taking into account soil resistivity effect, FIG. 7B shows a synoptic presentation of a second example of an extended physical model taking into account soil resistivity effect, FIG. 8 shows an example of a DC protection relay FIG. 9A shows an example of a simplified flowchart of the method and computer program according to the invention, FIG. 9B shows a synthetic diagram of inputs and outputs of operations according to the simplified flowchart of FIG. 9A, FIG. 10 shows a scheme of a meshed grid with single-conductor over-headlines and 3 MMC stations, FIG. 11 shows the result of a first example of simulation in a graph the fault resistance in function of the fault distance with cost function iso-levels and the estimation trajectory, FIG. 12 relates to FIG. 11 and shows in two graphs current and voltage transient behavior in function of time for comparing simulated measurements with the method according to the invention, FIG. 13 shows the result of a second example of simulation in a graph the fault resistance in function of the fault distance with cost function iso-levels and the estimation trajectory, FIG. 14 is related to FIG. 13 and shows in two graphs current and voltage transient behavior in function of time for comparing simulated measurements with the method according to the invention,

DETAILED DESCRIPTION

The embodiment(s) in the following description are only to be considered as examples. Although the description may refer to one or several embodiments, this does not mean inevitably that every reference concerns the same embodiment, or that the characteristics apply only to a single embodiment. Simple characteristics of various embodiments can be also combined to new embodiments that are not explicitly described.

In general, the invention applies to high and medium AC and DC voltage electric power transmission and/or distribution systems or grids.

By way of example, a specific embodiment related to high or medium voltage direct current network will be described hereafter.

FIG. 1 is a synoptic scheme of an example of a three nodes MTDC (Multi-Terminal high voltage Direct Current) network 100. The grid 100 comprises three DC current transmission lines $L_{12}$, $L_{13}$, $L_{23}$. At each end of the transmission lines $L_{12}$, $L_{13}$, $L_{23}$ are disposed respectively one DC breaking module $R_{i,j}$ (i, j=1, 2, 3, i≠j).

The ends of two neighboring DC breaking modules $R_{i,j}$ (i, j=1, 2, 3, i≠j), for example $R_{31}$ and $R_{32}$, are connected together to further DC breaking modules $R_{i,i}$ (i=1, 2, 3) which are further connected to DC/AC converters 113, 213, 313.

The breaking modules $R_{i,j}$ (i, j=1, 2, 3) comprise protection circuits that can be activated to protect the high voltage DC grid and in particular the converters 113, 213 and 313.

DC breaker module $R_{11}$ and converter 113 can be disposed in one station. Similar DC breaker module $R_{22}$ and the converter 213 can also be disposed in one station and DC breaker module $R_{33}$ and the converter 313 can be disposed in one station either.

Physical Modeling

Faults occurring on DC transmission lines $L_{12}$, $L_{13}$, $L_{23}$, can be described in the first milliseconds after the fault using the framework of traveling waves. Along a DC transmission line $L_{12}$, $L_{13}$, $L_{23}$, current and voltage verifies the Telegraphist's equations that can be written in the Laplace domain as:

$$\frac{\partial^2 V}{\partial x^2} = Z(s)Y(s)V \quad (1)$$

$$\frac{\partial^2 I}{\partial x^2} = Y(s)Z(s)I \quad (2)$$

where $Z(s)=R+sL$ and $Y(s)=G+sC$ are the transfer functions of the distributed series impedance and shunt admittance, respectively. When a fault occurs, voltage and current waves starting at fault location travel along the line according to $$V(s; d) = H(s; d)V_{init} \text{ and } I(s; d) = Z_c^{-1}V(s; d) \quad (3)$$

where $V_{init}$ is the initial surge at fault location and d the distance to the fault.

Hence the characteristic impedance Zc and the propagation function H characterizes the behavior of the line such that, $$H(s, d) = \exp(-\sqrt{YZ}\, d) \text{ and } Z_c(s) = \sqrt{Z/Y} \quad (4)$$

When a change of propagation medium occurs, the forward wave $V_f$ gives rise to transmitted and reflected waves, $V_t$ and $V_r$ respectively. The associated voltage at the station then is $V=V_t=V_f+V_r=(1+K)V_f=TV_f$, where the transmission and reflection coefficients T and K depend on the media characteristic impedance in particular of a related current transmission line $L_{12}$, $L_{13}$ or $L_{23}$, i.e., for a wave from media of characteristic impedance Z1 to media of characteristic impedance Z2, $$K_{1\to 2} = \frac{Z_2 - Z_1}{Z_2 + Z_1} \text{ and } T_{1\to 2} = \frac{2Z_2}{Z_2 + Z_1}. \quad (5)$$

Hence using those coefficients and the modeling of the line as described before one can track the traveling waves using a Bewley lattice diagram as shown in FIG. 2.

A Bewley lattice diagram shows the position and direction of motion of every generated, reflected, and transmitted wave caused by a fault on a transmission line.

As can be seen in FIG. 2, a fault has occurred, for example in current transmission line $L_{13}$, at $t_{fault}$ at a distance $d_{f,x}$ from a station x (for example DC breaking module $R_{31}$, or a station comprising DC breaker module $R_{11}$ and the converter 113) and $d_{f,y}$ from a station y (for example DC breaking module $R_{31}$, or a station comprising DC breaker module $R_{33}$ and the converter 313). In this diagram station x and y can for example be respective DC breaking modules $R_{13}$, $R_{31}$; $R_{12}$, $R_{21}$; $R_{13}$, $R_{31}$ at the end of the current transmission lines $L_{12}$, $L_{13}$ or $L_3$ or the stations described above. On this FIG. 2, one can see the propagation of two wave fronts $W_x$ and $W_y$.

However, to derive explicit expressions for the different waves, one has to precise the different terms in the model. Regarding the transmission line, a single conductor overhead line is considered. The effect of soil resistivity in the ground return path is neglected at this point, so that the characteristic impedance Z and admittance Y depends only on the overhead line characteristics. Moreover a lossless approximation, where series resistance R and shunt conductance G are neglected, allows for explicit expressions of Zc and H as functions of the per unit length series inductance L and shunt capacitance C $$H(s) = \exp(-s\sqrt{LC}\, d) \text{ and } Z_c = \sqrt{L/C}. \tag{6}$$

The relevance of this approximation is studied by plotting the evolution of the characteristic impedance $Z_c(s)=\sqrt{Z/Y}$ and the propagation constant $\gamma(s)=\sqrt{YZ}$ as a function of the frequency. This shown in FIG. 3. where first and second graphs from top to bottom show the frequency dependency of the characteristic impedance $Z^c$ and third and fourth graphs from top to bottom show the frequency dependency of the propagation constant $\gamma$.

Since the transient behavior has frequency content above 1 kHz, the lossless approximation is close to the general lossy case. Moreover, the frequency dependency of the line parameters themselves (L; C) was investigated using frequency dependent line model calculation function from EMTP-RV, showing that the line parameters do not depend on frequency.

Regarding the power converters 113, 213 or 313 at each station, Modular Multilevel Converters (MMC) are considered. With the rise of current, power electronics within the MMC will protect by auto blocking if the current reaches 2 p.u. which corresponds to currents ranging from 3 to 9 kA, depending on the characteristics of the grid.

Since only modeling of the 2-3 first waves after the fault is necessary to identify and localize the fault, it is reasonable to consider those components are not blocked at a first time.

Under that assumption, one can use a RLC equivalent for the MMC, i.e., $Z_{mmc}(s)=R_{mmc}+sL_{mmc}+1/(sC1_{mmc})$. Regarding the initial surge at fault location $V_{init}$, it can be modeled as a step voltage in series with the fault impedance. The step voltage is connected at the fault instant $t_f$ and has an amplitude opposite to the one just before fault occurrence at fault location, $$V_{init}(s, t_f, Z_f) = -v_{prior\,fault}\frac{Z_c}{Z_c + 2Z_f}\exp(-st_f). \tag{7}$$

Note the prior fault voltage at the fault location $v_{prior\,fault}$, is not measured. However, the prior fault behavior can be described using the Telegraphist's equations in steady state, $$\frac{\partial^2 V}{\partial^2 x^2} = RGV$$

where R and G are the distributed series resistance and shunt conductance, respectively. Typical values of those parameters are small, hence the voltage do not vary significantly along the distance for lines of several hundred km long. Thus, $v_{prior\,fault}$ can be replaced by the steady state voltage measured at the relay just before the fault is detected. Finally, the fault impedance accounts for different effects such as the electric arc, the tower grounding impedance, and resistance of additional unknown objects in the current path. It is generally considered those different elements can be accounted for using a single unknown fault resistance $R_f$. Hence knowing the characteristics of the different lines, stations and the topology of the gridone can derive expressions in the frequency domain for any traveling waves.

As an example, consider a fault occurred on the line $e_{x,y}$ between stations x and y, at a distance $d_{f,x}$ from the station x (FIG. 2). The nth forward and return waves at the station due to reflection at fault location is then expressed as a function of the fault parameters p in the Laplace domain as $$\begin{cases} V_{f,n}(s, p) = (K_x K_f)^{n-1} H(s, d_{f,x})^{2n-1} V_{init}(s, t_f) \\ V_{r,n}(s, p) = K_x V_{f,n}(s, p) \end{cases} \tag{8}$$

where $K_x$ and $K_f$ are the reflection coefficients from the line to the station x and to the fault respectively, as defined in equation (5).

Using the previous methodology, one can then get back to temporal domain expressions using inverse Laplace transform. This is due to the different hypotheses made before, such as the loss-less approximation and the linear modeling of the MMC stations. Examples of such formulas for the first wave in equation (8) are given below $$v_{f,1}(t) = -\frac{V_f R_f}{Z_c + 2R_f}u(t - t_d)$$

and $$v_{r,1}(t) = \frac{2\sqrt{C_{mmc}}\, V_f Z_c^2}{(Z_c + 2R_f)A}\sinh\left(\frac{(t-t_d)A}{4\sqrt{C_{mmc} L_{mmc}}}\right)$$

$$\times \exp\left(-\frac{(2R_{mmc} + Z_c)(t-t_d)}{4 L_{mmc}}\right)u(t-t_d)$$

where $A=\sqrt{C_{mmc}(2R_{mmc}+Z_c)^2-16L_{mmc}}$ is a scalar coefficient depending solely on the line surge impedance and the MMC parameters. The time $t_d$ is the detection time corresponding to the arrival time of the first wave. It can be expressed as a function of the fault time $t_f$, the fault distance $d_f$ and the wave speed $c_w=1/\sqrt{LC}$; $t_d=t_f+d_f/c_w$. Similar expressions can be obtained for the other waves due to reflection and the fault and for waves due to reflection at other stations. The total voltage at the station is then the sum of the measured prior fault voltage $v(t=t_d)$ and the different waves arriving at the station as derived in the Bewley diagram in FIG. 2.

$$v_m(t) = v(t_d^-) + v_{f,1}(t) + v_{r,1}(t) + v_{f,2}(t) + v_{r,2}(t) + \quad (9)$$

The number of reflections taken into account depends on a trade off between the complexity and desired time validity range of the model.

In most of the cases, in order to detect and locate faults rapidly for allowing to shut down for example a current transmission line where a fault occurred, the first wave coming from the fault along with the first reflected wave due to the reflection at the fault or at the remote station are needed. In many cases, the very first wave coming directly after fault occurrence is sufficient. Depending on the requested precision needed, more waves (2 or 3) even up to 4 waves can be taken into account to identify and locate the fault.

Since the characteristic impedance is a scalar, the current derivation can be deduced from the voltage.

$$i_m(t) = i(t_d^-) + Z_c^{-1}(v_{f,1}(t) - v_{r,1}(t) + v_{f,2}(t) \ldots) \quad (10)$$

The obtained formulas depend on the known characteristics of the grid, and on measured quantities such as the detection time and the prior fault conditions and also on the fault parameters $p=(e_{x,y}; d_{f,x}; d_{f,y}; R_f; t_f)^T$ that are unknown and need to be identified.

In conclusion, an analytical parametric model (physical model) based on wave propagation and allowing to predict the current and voltage evolution in case of fault occurrence, depending on a set of physical fault parameters has been developed here above. This physical model can be inverted in a way that when a fault is suspected, one can determine the fault parameters from current and voltage measurements available at dedicated points in the grids for example at a relay or a DC breaker circuit.

It is important to notice that only one physical model is necessary and that by the way of inversion, fault parameters can be determined in using only the current and voltage measurements realized some milliseconds upon appearance of the faults.

Soil Resistivity Modeling

As mentioned, the physical model above neglects the effect of the soil resistivity, noted ρ. In many cases, in particular if the value of the soil resistivity is very low, for instance in case of return through see water, soil resistivity may be neglected. Besides, the effect of soil resistivity increases with the fault distance. Hence if the fault is suspected to be quite close to the relay (up to 5 km for instance) the soil resistivity can also be neglected. However, in a more developed approach soil resistivity may be taken into account.

While different ways to model physically the behavior of ground return exist, they do not lead to an analytic and explicit solution of the current and voltage transient evolution.

In order to complete soil resistivity effects into the previously obtained model a behavioral approach is proposed taking the previously developed physical model neglecting earth influence ($v_m$ (p; t); $i_m$ (p; t)) as input and produces an new model ($v_{m,g}$ (p; t; ρ); $i_{m,g}$ (p; t; ρ)) that still depends on the fault parameters.

To do this, an extended model (ARX model—Autoregressive model with eXternal inputs) is proposed that is a filtering of the previous physical model:

$$y_{m,g}(p, \rho, t_k) = G(z^{-1})y_m(p, t_k) \quad (11)$$

where $G(z^{-1})=(B(z^{-1})/A(z^{-1}))$ is a function to be determined. The polynomial $A(z^{-1})=1-a_1z^{-1}-\ldots-a_{na}z^{na}$ is an autoregressive part that represents the inductive effect of the soil resistivity while $B(z^{-1})=z^{nk}(b_0+b_1z^{-1}+\ldots+b_{na}z^{nb})$ is a exogenous part that takes the previous model as external input.

Coefficients $n_a$ and $n_b$ are the orders of the polynomials A and B respectively, $n_k$ is a dead-time that represents a delay in the system response.

Note the models $y_m=(v_m; i_m)^T$ and $y_{m,g}=(v_{m,g}; i_{m,g})^T$ include both current and voltage. In order to identify coefficients $a_i$; $b_i$ the measurements model is to be considered:

$$A(z^{-1})y(t_k) = B(z^{-1})y_m(p, t_k) + \varepsilon(k) \quad (12)$$

where $y=(v; i)^T$ are the measurements and ε(k) is a measurement error term. Hence the parameters $a_i$; $b_i$ can be identified using least squares by minimizing $\varepsilon^T\varepsilon$. One then must select appropriate orders by comparing the goodness of fit for different values of ($n_a$; $n_b$; $n_k$).

FIG. 4 shows two graphs modelling voltage and current in function of time for soil resistivity effect modeling using an ARX 11 model (meaning the orders of the polynomials are $n_a=1$, $n_b=0$, i.e., one coefficient $a_1$ and one coefficient $b_0$ are to be identified) as explained above.

The measurements data are obtained using Electro-Magnetic Transient (EMT) software EMTP-RV. One can see that the filtering stage applied to the approximate physical model improves the accuracy of the model) with respect to the simulated measurement data (in dots EMTP simulation).

As suggested in equation (11), the transfer function G that models the effect of soil resistivity depends on the value of ρ. Moreover, the inductive effect of the ground is expected to increase with the distance to the fault, so that G also depends on the fault parameters p through $d_f$. Hence, for a given set of fault parameters p and a given value of soil resistivity ρ, one can find coefficients $a_i(p; \rho)$; $b_i(p; \rho)$ that defines a filter G(p; ρ). The evolution of the filter parameters as function of the fault distance can be made explicit using some interpolation function such as $$a_1(d_f) = \alpha_{1,0} + \alpha_{1,1}d_f^{-1} + \alpha_{1,2}d_f^{-2}$$
$$b_0(d_f) = \beta_{0,0} + \beta_{0,1}d_f^{-1} + \beta_{0,2}d_f^{-2}.$$

An example of the evolution of such coefficients with the fault distance and the corresponding fitting function for an ARX 11 model is plotted on FIG. 5 showing a graph of filter coefficients in function of fault distance $d_f$. Note the inductive effect, represented by parameter $a_1$ is more important as distance increases whereas the approximate physical model, through $b_0$, is predominant for small $d_f$.

Hence the extended model is able to predict the effect of soil resistivity on the first wave using a filter $G(d_f; \rho)$ that depends explicitly on the fault parameters through $d_f$. To adapt this approach to the following waves due to reflection at the fault or at the remote station, it is proposed to aggregate the effect of soil resistivity using a single filter on each wave. Those filters are the one obtained previously through the modeling of the first wave but the fault distance is adjusted to account for the total distance traveled by a given wave. For instance the first wave due to reflection at the fault location travels thrice the fault distance and is thus obtained by filtering the model with soil effect $\gamma_{m,2}$ through the filter given by $G(3d_f; \rho)$. Similarly the first wave coming from the remote station uses a filter $G(2D-d_f; \rho)$. Such an approach makes the hypothesis that the effect of soil resistivity can be lumped in a single filter for each wave but it allows to capture most of the effect of the soil using an single adaptable filter. FIG. 6 shows two graphs modelling voltage and current in function of time for soil resistivity effect modeling using ARX11 model with a fault at 30 km from a relay station. As can be seen on the FIG. 6, the extended physical model correctly fits with the simulated measurement data (in dots EMTP simulation)

FIG. 7A shows a synoptic presentation of a first example of the extended physical model taking into account soil resistivity effect as presented here above.

The obtained model is a combination of physical and behavioral approaches and depends explicitly on the fault parameters.

Thus, in measuring voltage and current at dedicated points in the grid, by inverting the extended physical model when a fault is suspected, one can determine the fault parameters from those current and voltage measurements available at dedicated points in the grids for example at a relay or a DC breaker circuit, and this even in the case soil resistivity cannot be neglected.

FIG. 7B shows a synoptic presentation of a second example of the extended physical model taking into account soil resistivity effect as presented here above. With respect to FIG. 7A, the physical model may be aggregated with the behavioral model with a part that does not pass into the behavioral model. As mentioned above, it may be sufficient to use the physical model if soil resistivity effects are negligible (if the fault distance is small or the value of the soil resistivity is small). Otherwise, it is preferable to use the extended model with the behavioral approach.

Systematic Modeling of Traveling Waves

Some electric power transmission and/or distribution systems may include several junction points where waves are reflected and transmitted. This is for example the case when current transmission lines are hybrid, i,e., composed of overhead current transmission lines and/or underground and/or submarine current transmission lines.

In such a network a systematic approach is needed to account for any possible wave traveling through a grid and to filter out non-pertinent signals. When a fault occurs on a hybrid transmission line, it is important to identify which section is faulty because faults on overhead line are generally temporary. This allows reclosing the line after some time typically 200-500 ms whereas faults on underground or submarine cables are generally permanent and reclosing should be avoided.

A protected network can be described by a graph g containing a set of vertexes $v_f$ representing nodes between two or more current transmission line segments, like stations or junctions between overhead current transmission lines and underground current transmission lines. A vertex is denoted $q_i$. The graph contains a set of edges $\varepsilon_f$ representing the network current transmission lines segments, which can be overhead current transmission lines or underground current transmission lines. The edge between the nodes $q_i$, $q_j$ is noted $e_{i,j}$. A fault location corresponds to a node $q_f$ and the considered measurement point is the node $q_s$.

All possible traveling waves in a grid due to a fault can be described by every possible paths between the fault location and the measurement point, the node $q_s$. All the possible paths can therefore be described by the set $$\mathcal{P}_{q_f \to q_s} = \{\pi = (q^1, \ldots, q^n) \mid q^1 = q_f, q^n = q_s, q^i \in v_f, (q^i, q^{i+1}) \in \varepsilon_f\}$$

In order to compute only finite number of traveling waves, one only considers the waves that can reach the node $q_s$ before some maximum time $t_{max}$. For instance one possible value is $t_{max} = 2d_L/c$, where $d_L$ is the total length of the protected line and c is the speed of light. $t_{max}$ is typically in a range between 1-10 ms, more specifically between 1-5 ms.

Consider a particular voltage wave traveling through a path π. As the loss-less Telegraph equations correspond to a pure delay, the output of the physical model can be written in the Laplace domain as $$V_\pi^\varphi(s, p) = V_{\pi,i}(s, R_f) \exp(-\tau_\pi(d_f)s)$$

where $\tau_\pi$ accounts for the total delay due to the propagation of the wave through the path π, which depends on the fault distance. $v_{\pi,i}$ accounts for all the reflections and transmissions that occur at each junction. For a given path π, one can gather the coefficients involved at each junction $$\prod_{i=1}^{n-1} J_{(q^{i-1}, q^i) \to (q^i, q^{i+1})}(s, r_f)$$

Where the coefficients can be reflection or transmission coefficients $$J_{(q^{i-1}, q^i) \to (q^i, q^{i+1})} = \begin{cases} T_{(q^{i-1}, q^i) \to (q^i, q^{i+1})}, & q^{i-1} \neq q^{i+1} \\ K_{(q^{i-1}, q^i) \to (q^i, q^{i+1})}, & q^{i-1} = q^{i+1} \end{cases}$$

By convention the first coefficient corresponds to the initial surge at the fault location. The interface part $v_{\pi,i}$ of the physical model gathers all those coefficients, in addition to the initial step occurring at the fault instant $$V_{\pi,i} = \prod_{i=1}^{n-1} J_{(q^{i-1}, q^i) \to (q^i, q^{i+1})}(s, r_f) \times \exp(-st_f)$$

The physical model computes all possible traveling waves on the network that can reach the observation point before some maximum time $t_{max}$ with respect to the fault inception time at node $q_s$. Those different traveling waves can be displayed in the form of a Bewley Lattice diagram.

Behavioral Modeling

A wave traveling through an edge e either corresponding to a portion of over-head current transmission line or an underground current transmission line is both distorted and attenuated. Those effects are in particular due to the frequency dependent behavior of the current transmission lines and the influence of the soil resistivity. To account for such effects, a behavioral approach is applied using the step response of the transmission lines. The step response of a given edge e can be obtained using EMT simulation software such as EMTP, knowing the geometry of the transmission lines and the characteristics of the conductors. In particular, the step response depends on the length of the considered segment $d_e$ and the value of the soil resistivity $\rho_e$. Considering a set of known step responses $b_{d,\rho}(k)$ for various edge lengths $(d_1; d_2, \ldots, d_n)$ and various soil resistivity $(\rho_1; \rho_2; \ldots; \rho_n)$. In order to get a step response for any length and any soil resistivity, the following interpolation for the step response $b_{d,\rho}(k)$ is proposed, where $\rho_1 < \rho < \rho_2$ and $d_1 < d < d_2$.

$$b_{d,\rho}(k) = \frac{b_{d,\rho_2}(k) - b_{d,\rho_1}(k)}{\log(\rho_2) - \log(\rho_1)}(\log(\rho) - \log(\rho_1)) + b_{d,\rho_1}(k)$$

$$b_{d,\rho_1}(k) = \frac{b_{d_2,\rho_1}(k) - b_{d_1,\rho_1}(k)}{(d_2 - d_1)}(d - d_1) + b_{d_1,\rho_1}(k)$$

The step response of a given edge e is differentiated to obtain the impulse response $h_e(k)$. The total distortion and attenuation of a wave is obtained by combining the impulse responses of all the traveled edges.

The principle of cascading the different impulse response filters is shown in Figure XX. Hence, the total output of the model of a given wave is then obtained as.

$$v_\pi^m = v_\pi^\varphi * \prod_{e \in \pi} h_e$$

Where the inversion of Laplace domain expressions can be done using the inverse Fourier transform. The total voltage model is composed of all the waves travelling through a path $\pi$ from the fault location to the observation point in less than a time $t_{max}$.

$$v^m(p, t_k) = \sum_{\pi \in \mathcal{P}_{q_f \to q_s, t_{max}}} v_\pi^m(p, t_k)$$

Fault Identification and Localization

Taking into account the above exposures, in only monitoring current i and voltage v at dedicated locations of the grid, in particular at the terminals of the currents transmission lines like $L_{12}$, $L_{13}$ or $L_{23}$ for example, one can invert the calculations in order to determine the relevant fault parameters, in particular localization of the fault. It is important to notice that each dedicated location can deliver the information of the relevant fault parameters, in particular identification and localization of a fault without taking into account the measurements realized at another location.

FIG. 8 shows an example of relay $R_{i,j}$ (i, j=1, 2, 3) equipped with a fault identification module 20. The part of DC breaking module $R_{i,j}$ (i, j=1, 2, 3) dedicated to break the circuit is known to the man skilled in the art and not described in more detail.

Such fault identification module 20 can also be installed in other units of the grid and in other locations without departing from the invention. In particular one may envisage that such fault identification module 20 is installed in a converter station or more generally in a relay.

For improving protection of the grid 100, it seems appropriate that one fault identification module 20 is installed at each end of a current transmission line $L_{12}$, $L_{13}$ or $L_{23}$ allowing to identify rapidly a fault and control and command for example the two DC breaking module $R_{13}$ and $R_{31}$ if the fault has occurred on current transmission line $L_{13}$, $R_{23}$ and $R_{32}$ if the fault has occurred on current transmission line $L_{23}$, or $R_{12}$ and $R_{21}$ if the fault has occurred on current transmission line $L_{12}$. As will be set out hereafter, the fault identification modules 20 that are integrated into relays $R_{i,j}$ (i, j=1, 2, 3) function independently from each other, at their own location.

The fault identification module 20 comprises a current measurement input 22 and a voltage measurement input 24. Therefore current and voltage measurement are realized at one location, here for example within relays $R_{i,j}$ (i, j=1, 2, 3). Each input is for example connected to dedicated sensors that are known in the art in particular for HVDC grids. The sensors may comprise optical, electrical or other sensors. They may function based on diverse physical effects, like for example Hall effect, Faraday effect, Zeeman or Stark effect in order to cite only some sensors suitable to furnish relevant current and voltage measurements in a high voltage DC environment.

The fault identification module 20 can be considered as an autonomous local unit and comprises for example one or several memory 26 for storing a computer program configured to calculate on the basis of preregistered parameters, like line parameters, station parameters and parameters relating to the grid topology and in particular the physical parameters of the current transmission lines $L_{12}$, $L_{13}$ or $L_{23}$ (conductor diameter, resistivity of the line per unit length, shielding parameters etc) and the current and voltage measurements received from the input fault parameters. The memory(-ies) can also memorize the preregistered parameters. The preregistered parameters can be determined by calculation, specific measurements, for example before entering in service of the grid, or by calibration, for example in running the grid 100 according to a specific calibration protocol or according to a nominal service.

The fault identification module 20 comprises in addition for example one or several processors 28 for executing the computer program for calculation of the fault parameters.

In case the fault identification module 20 establishes the presence of a fault for example on the current transmission line $L_{12}$, $L_{13}$ or $L_{23}$ to which it is dedicated, the identification module 20 can be configured to output a control signal for example on output 30, in particular to activate a specific breaking module, for example DC breaking module $R_{i,j}$ (i, j=1, 2, 3).

It is important to notice that the fault identification module only needs for reliable functioning the current and voltage measurement at one location, like for example at one end of the current transmission lines $L_{12}$, $L_{13}$ or $L_{23}$, where other known methods rely on measurements that are conducted on both ends of the transmission line. This is quite an advantage, in particular for allowing much faster detection as there is no need for consolidation of measurements realized at different locations.

FIG. 9A shows an example of a simplified flowchart of the method and computer program according to the invention that may be executed by the processor of the fault identification module 20 and FIG. 9B shows a synthetic diagram of inputs and outputs of operations according to the simplified flowchart of FIG. 9A.

In step 600, the method starts. This start can be triggered for example when an unusual behavior with respect to the nominal behavior of the grid 100 or of the transmission lines $L_{12}$, $L_{13}$ or $L_{23}$ is detected for example via sensors like current sensors $i_{i,j}$ (i, j=1, 2, 3, i≠j) or voltage sensors $v_i$ (i=1, 2, 3) which are symbolized in FIG. 9B or 10.

Such unusual behavior may be detected using a threshold on the voltage drop, on the rate of change of the voltage, or on the increase of the current, or a combination of both.

In one embodiment, one may monitor in a sliding window voltage v and current i, for determining such unusual behavior.

In another embodiment, one may consider thresholds that are for example exceeded.

Then in step 602, the fault detection module 20 is fed with the current and voltage transients (current and voltage evolutions) that are measured for example via sensors like current sensors $i_{i,j}$ (i, j=1, 2, 3, i≠j) or voltage sensors $v_i$ (i=1, 2, 3).

Typical voltage and current transients are shown in FIG. 6. It is clear that the sampling of the current and voltage measurements must be fast enough to accurate represent the evolution of current and voltage. As can be seen on FIG. 6, a transient may last 600 μs and the first voltage drop occurs in a window of less than 100 μs. Thus sampling should be for example as fast 10 μs. Due to the fast dynamics of the traveling waves, a sampling frequency of 500 to 1000 kHz is required.

In step 604, in using the physical model described above or the extended physical model taking into account soil resistivity (FIG. 7A or 7B), calculations are carried out by the fault detection module 20 in order to determine the unknown fault parameters for example $d_f$, $R_f$. Indeed, Given a value of fault parameters p, one can compare the outputs from the analytical model embedded in the relay, and the available measurements, as shown in FIG. 9B.

To do this, the method and the computer program executed by the processor 28 may for example use an appropriate cost function that evaluates the mismatch between the model outputs $\hat{v}_{x,e}(p; t)$, $\hat{i}_{x,e}(p; t)$ and the measurements ($v_{x,e}$; $i_{x,e}$).

The relay x (for example DC breaking module $R_{13}$) and line e (for example current transmission line $L_{12}$) being fixed, they are omitted in the subscript in the following section. One possible choice of cost function uses the least squares:

$$C^n(p) = \lambda \sum_{k=1}^{n}(v(t_k) - \hat{v}(p, t_k))^2 + \mu \sum_{k=1}^{n}(i(t_k) - \hat{i}(p, t_k))^2$$

$$C^n(p) = F^{(n)}(p)^T F^{(n)}(p)$$

where n is the number of available data samples, and λ,μ are weighting factors between current and voltage. Either λ or μ can be set to 0 if one wishes to use only current or voltage measurement. In order to estimate the fault parameters, one aims at minimizing the cost function, i.e., find $\hat{p}^{(n)}$ such that $$\hat{p}^{(n)} = \underset{p}{\operatorname{argmin}} C^{(n)}(p). \quad (15)$$

Note the number of unknown parameters in p that are to be identified can be reduced using prior knowledge on the line total length $D_{x,y}=d_{f,x}+d_{f,y}$. For a given number of observations n, iterative optimization techniques such as Gauss-Newton or Levenberg-Marquardt may be used to find the optimum. Starting from an initial guess $p_0$ the algorithm proceeds step by step using a correction term $\delta_k$, i.e.:

$$p_{k+1}^{(n)} = p_k^{(n)} + \delta_k$$

Moreover, measurements are added to the cost function after each step/iteration to improve the estimate. Hence the estimated parameters from the last step are used as initial guess for the next step.

$$p_0^{(n+\Delta n)} = p_1^{(n)}.$$

In particular, the method can begin at the very first detection of the fault and the iteration is enriched with new incoming measurements in real time. Δn is the number of additional data points at each estimation step and is considered constant. A smaller Δn means new data are added more frequently, increasing the precision of the algorithm, but the total number of iterations will also increase, making the algorithm slower. Δn should then be tuned to meet both speed and precision requirements. The algorithm proceeds until a stopping condition is reached, which is detailed hereafter.

In step 606, the method stops as soon as it has successfully converged to a satisfying estimate of the fault parameters, meaning the fault is identified to be on the protected line.

In case of successful detection of the fault on the dedicated current transmission line $L_{12}$, $L_{13}$ or $L_{23}$, a control signal may be outputted in step 608 by the fault identification module 20 in order to activate for example the DC breaker $R_{13}$.

One should emphasize that each fault detection module 20 is autonomous and relies on its own current and voltage measurements at its own location. Therefore, fault identification can be carried out with current and voltage measurements at a single location which allows quite faster detection of a fault and allows to take the necessary protection steps for example by activating a specific DC breaker for protection purposes. This is also a feature distinguishing the present method to those of the prior art that may allow to locate a fault, but that are not fast enough to activate protection devices in an electric power transmission and/or distribution system.

The method also monitors the number of iterations for example and if no convergence criterion is met (step 610), the method may stop in step 612 after reaching a maximum number of iterations, corresponding to a maximum measurement window, or after receiving communications from neighboring relays indicating the fault has been identified on an adjacent line.

Two indicators may for example be used to evaluate the convergence and consistency of the results with the hypothesis that the monitored line is faulty. This is done in step 606 after each iteration of the estimation algorithm so that the fault can be identified as fast as possible.

First the estimated parameters must belong to a certain validity domain that represents plausible values for the fault parameters such as $$D_p = \{(d_f, R_f) \mid d_{min} \leq d_f \leq d_{max}, R_{min} \leq R_f < R_{max}\}$$

where ($d_{min}$; $d_{max}$) defines the portion of the line monitored by the relay and ($R_{min}$; $R_{max}$) the range of fault resistance that requires fast decision, since high value of Rf indicates the fault is not critical and more time is available to take action. Typical boundary values are $d_{min}$=0 km; $d_{max}$=90% $D_{tot}$ and $R_{max}$=0Ω; $R_{max}$=200Ω.

Second, a consistency test is used to evaluate the confidence one has in the results of the estimation. One possible approach used here may be the Cramér-Rao Lower Bound (CRLB) to benefit from prior knowledge on sensors and which gives a reasonable evaluation of the efficiency of the estimation process. Under the "regularity" conditions and considering the estimator is unbiased the CRLB states that the following matrix inequality holds $$P_{ls}(p^*) \geq I^{-1}(p^*) \qquad (16)$$

where $P_{ls}$ is the covariance of the estimator and I the Fisher information, both with respect to the true vector of the parameters $p^*$, in practice replaced by the estimated vector $\hat{p}$. An estimate of the covariance of the maximum likelihood estimator is $$P_{ls} = \sigma^2 (\mathcal{J}_F^T(p^*)\mathcal{J}_F(p^*))^{-1}$$

where JF is the Jacobian of the F vector as introduced in equation (14) with respect to the parameters p. The noise variance $\sigma^2$ can be replaced by an unbiased estimate $$\hat{\sigma}^2 = \frac{1}{n_t - n_p} F^{(n)}(p^*)^T F^{(n)}(p^*).$$

The Fisher information is given by $$I = \mathcal{J}_F^T(p^*) \sum\nolimits^{-1} \mathcal{J}_F(p^*)$$

where $\Sigma$ is the measurement noise covariance matrix, supposed known using prior information on sensors. As the estimation algorithm proceeds, the estimated parameters will get closer to the true value of the parameters and the estimator covariance closer to the inverse of the Fisher information. Hence we test the consistency of the estimation process using a threshold on the CRLB equation (16), for instance $$S \geq \|P_{ls}(\hat{p}) - I^{-1}(\hat{p})\|.$$

Such threshold must be tuned to ensure both selectivity and sensitivity, i.e., to avoid false positives and true negatives. Tuning is done heuristically considering in particular limit cases where faults occurring on an adjacent line are harder to distinguish from fault occurring within the validity domain $D_p$.

Simulation Results

In order to test the proposed algorithm in open-loop, measurements were simulated using EMT software EMTP-RV. Consider a meshed grid with single-conductor overheadlines and 3 MMC stations as shown in FIG. 10). Numerical values for the line and station physical characteristics as well as the parameters used in the model are presented in Tables I, II and IV, V. MMC are simulated with switching function of arms and a wide-band model is used for the transmission lines. Models for sensors are also included to reflect measurements errors (Table III). Numerical values used for tuning the algorithm are listed in Table VI.

TABLE I

CHARACTERISTICS OF THE MMC STATIONS

| | |
|---|---|
| Rated power (MW) | 1000 |
| DC rated voltage | 320 |
| Arm inductance (p.u.) | 0.15 |
| Transformer resistance (p.u.) | 0.001 |
| Capacitor energy in each submodule (kJ/MVA) | 40 |
| Conduction losses of each IGBT/diode | 0.001 |
| Number of sub-modules per arm | 400 |

TABLE II

OVERHEAD-LINE CHARACTERISTICS

| | $L_{13}$ | $L_{12}$ | $L_{23}$ |
|---|---|---|---|
| Length (km) | 200 | 100 | 150 |
| DC resistance (mΩ/km) | | | 24 |
| Outside diameter (cm) | | | 4.775 |
| Horizontal distance (m) | | | 5 |
| Vertical height at tower (m) | | | 30 |
| Vertical height at mid-span (m) | | | 10 |
| Soil resistivity (Ωm) | | | 100 |

TABLE III

SENSOR SPECIFICATIONS

| | Current | Voltage |
|---|---|---|
| Accuracy class | 1% | 1% |
| Bandwidth (kHz) | 300 | 300 |
| Sampling frequency (MHz) | 1 | 1 |
| Resolution (bits) | 16 | 16 |

TABLE IV

EQUIVALENT PARAMETERS OF THE MMC STATIONS

| | |
|---|---|
| Equivalent inductance (mH) | 8.1 |
| Equivalent resistance (Ω) | 0.4 |
| Equivalent capacitance (µF) | 391 |

TABLE V

OVERHEAD-LINE DISTRIBUTED PARAMETERS

| | $L_{13}$ | $L_{12}$ | $L_{23}$ |
|---|---|---|---|
| Series resistance R (mΩ/km) | | | 24 |
| Series inductance L (mH/km) | | | 1.45 |
| Shunt capacitance C (nF/km) | | | 7.68 |
| Shunt conductance G (nS/km) | | | 0.2 |

TABLE VI

ALGORITHM TUNING PARAMETERS.

| Parameter | Value |
|---|---|
| Initial point, $p_0$ | $R_{init} = 1\ \Omega$, $d_{init} = 6$ km |
| Added data points per iteration, $\Delta n$ | 10 |
| Consistency threshold, S | 1 |
| Maximum measurement window | $3D/c_w$ |

To illustrate the operation of the protection algorithm, two typical use cases are studied where a pole to ground fault occurs between station 3 and 1, in the grid of FIG. 10. Consider in a first example a fault located at $d^*_f=30$ km from station 313 with an impedance of $R^*_f=20\Omega$. Once the fault is detected at relay $R_{31}$ (=DC breaking module with integrated fault identification module 20), the behavior of the estimation algorithm can be represented by plotting the evolution of the estimated parameters and the cost function levels, which also changes after each iteration due to new measurements being added. Hence the cost function and the estimated parameters are plotted in FIG. 11 after 5 iterations, when the method stops.

The algorithm stops and identifies the faults after 0.056 ms measurement window, after satisfying both feasibility and confidence criteria. Final estimated parameters are $\widehat{d_{f^*}}=25$ km and $\widehat{R_{f^*}}=22\Omega$. Predicted voltage and current are plotted against simulated measurements in FIG. 12. Here the first wave seems to be sufficient to estimate the fault parameters and identify the fault. This allows ultra-fast operation but limits the precision of the estimated parameters. A longer measurement window of 0.250 ms gives the following estimated parameters $\widehat{d_f}=31$ km and $\widehat{R_f}=18\Omega$.

To test for the remote fault case, consider a in a second example fault at $d^*_f=140$ km from station 313 on the same line with an impedance of $R^*_f=40\Omega$. In that case, the relay $R_{31}$ (DC breaking module with integrated fault identification module 20) identifies the fault after 0.116 ms measurement window with estimated parameters $\widehat{d_f}=92$ km and $\widehat{R_f}=64\Omega$.

Evolution of the estimation algorithm is displayed on FIG. 13, analogue to FIG. 11 and starting from the same initial point. The corresponding transient voltage and current, analogue to FIG. 12, are displayed FIG. 14. The precision of the estimated parameters decreased compared to the previous first example considered as "close fault" case. This is largely due to the decreasing precision of soil resistivity effects with larger fault distance. As for the previous example, a longer measurement window would increase the precision. For instance a measurement window of 0.670 ms leads to estimated parameters $\widehat{d_f}=131$ km and $\widehat{R_f}=39\Omega$.

Thus a the method according to the invention may carry out the measurements during a very short measurement window, for example less than 0.250 ms, in particular less than 150 ms and specifically less than 100 ms.

The inventors carried out extensive simulations and validated the behavior of the method on a wide range of fault characteristics.

Taking full benefit of the information contained in the first waves after fault occurrence, identification of the fault can be performed in less than 1 ms, which is sufficient to trigger for example associated DC breakers to protect the grid 100. Contrarily to existing single ended algorithm, DC reactors are not required to achieve selectivity. Extensive simulations in EMTP software showed the method is applicable on a wide range of fault cases regarding fault distance and resistance.

One understands that the method according the invention allows a very fast fault identification and localization which allows to protect the grid in a more efficient and reliable way.

The invention has been described in relationship with Delta high voltage DC grids (FIGS. 1 and 10), but the invention also applies to other high voltage DC grids, even more complex.

A DC transmission line in bipolar architecture or symmetrical monopolar architecture is composed by a multi-conductor system (e.g. the positive and negative poles) and hence there are mutual impedances and mutual admittances between the conductors. The measured phase voltages and currents can be transformed in modal circuit that are not coupled. The mathematical basis for the transformation are well known from the literature and resides in the theory of eigenvalues and eigenvectors of the impedance and admittance matrices (see for example E. W. Kimbark, "Transient overvoltages caused by monopolar ground fault on bipolar dc line: theory and simulation," *IEEE Trans. Power App. Syst.*, vol. PAS-89, no. 4, pp. 584-592, April 1970. The proposed algorithm can be applied taking into account the modal voltage and currents. The cost function can compare simulated modal voltage and current with measured voltage and current transformed in modal domain.

The proposed algorithm can also be applied to identify faults on a power transmission line in an AC electrical power transmission and/or distribution system.

After a short circuit fault on an AC transmission line, voltage and current transients can be measured at the line end as this has been described above with respect to the DC grid.

Two cases may be considered:

In a first case, the fault generates voltage and current travelling waves that propagate along the transmission lines. Such travelling waves can be described using Telegraphist's equations, similarly to what has been presented for a DC system here above.

It can be noted that AC line model employed to describe travelling wave propagation is the same as the one presented for the DC line. In order to use the single phase Telegraphist's equations as explained hereabove, it is necessary to decouple the n-phases (normally 3 phases) of the AC system using a transformation matrix as known from literature, see for example M. Bollen, "On travelling-wave-based protection of high voltage networks," Ph.D. dissertation, TU Eindhoven, Eindhoven, The Netherlands, 1989.

High frequency model (1-10 kHz) of the AC substation equipment are also well know from literature. As an example a transformer connected to the AC substation could be represented by a simple inductance in series with a resistance.

Pre-fault voltage is measured at the line end. In case of very long line, correction of the phase voltage along the line can be taken into account. This can allow a better calculation of the pre-fault voltage at the fault point.

According to a second case, concerns the pre-fault voltage at fault location is close to zero the generated travelling waves may not be detectable by the instrument transformers. In this particular case the fault identification algorithm could not be based on Telegraphist's equations. Nevertheless a physical model capable of calculate the post fault current and voltage transients could still be identified, for example considering simple equations based on concentrated model of the line.

The invention claimed is:

1. A transient based method for identifying faults in an electric power transmission and/or distribution system comprising a current transmission line, said method comprising
generating a physical model of the current transmission line, the physical model depending on fault parameters and describing the behavior of voltage and/or current transients due to a fault in the current transmission line, said fault parameters comprising a fault location parameter on said current transmission line and a fault impedance parameter,
measuring voltage and/or current evolution at a specific location in said power system,
iteratively simulating the voltage and/or current evolution by the physical model at a measurement point with a set of fault parameters, wherein each step of iteration comprises comparing simulated and measured voltage and/or current evolutions and adapting the set of fault parameters according to a convergence criterion, and
identifying a fault and fault parameters thereof upon having reached convergence of the measured voltage and/or current evolution and the simulated voltage and/or current evolution,
wherein the physical model is based on a telegraph equation for describing the fault parameters and the behavior of travelling waves due to the fault in said electrical power transmission and/or distribution system, and
wherein the only traveling waves are taken into account when iteratively simulating the voltage and/or current evolution are those that can reach the measurement point before a predetermined maximum time $t_{max}$ between one and ten milliseconds.

2. The method according to claim 1, wherein the measurements of voltage and/or current evolution are carried out at several specific locations in the said power system, each corresponding to a measurement point and wherein the steps of iteratively simulating of the voltage and/or current evolution and identifying a fault with its fault parameters are carried out for each measurement point independently from the other measurement points.

3. The method according claim 1, further comprising extending the physical model to take into account soil resistivity.

4. The method according to claim 3, wherein extending the physical model for taking into account soil resistivity comprises implementing a filtering function.

5. The method according to claim 1, wherein said electrical power transmission and/or distributor system is a high or medium voltage DC grid comprising overhead current transmission lines and/or underground and/or submarine current transmission lines.

6. The method according to claim 1, wherein said electrical power transmission and/or distributor system is a high or medium voltage AC grid.

7. The method according to claim 1, wherein said physical model takes into account modal voltage and current.

8. The method according to claim 1, wherein the convergence criterion comprises the minimization of a cost function of the difference of simulated and measured voltage and/or current evolutions.

9. The method according to claim 1, wherein identifying identification of a fault comprises verifying that the obtained fault parameters belong to a predefined validity domain.

10. The method according to claim 1, wherein each iteration step comprises completing voltage and/or current evolutions at specific locations in said electrical power transmission and/or distribution system with ongoing measurements at said measurement point.

11. The method according to claim 1, wherein the specific location is at one of an end of said current transmission line ($L_{12}$, $L_{13}$, $L_{23}$), a relay, a breaker module, and a station.

12. The method according to claim 1, further comprising detecting unusual behavior with respect to a nominal functioning of the electrical power transmission and/or distribution system and thereafter iteratively simulating the voltage and/or current evolution by the physical model.

13. The method according to claim 12, wherein detecting said unusual behavior comprises detecting at least one of a voltage drop, a current increase, and a crossing of a threshold.

14. The method according to claim 1, further comprising, after having identified said fault, generating an output in order to activate protection circuits in said electrical power transmission and/or distribution system.

15. An apparatus comprising
a fault-identification module for identifying faults in an electrical power transmission and/or distribution system having a current transmission line ($L_{12}$, $L_{13}$, $L_{23}$) the fault-identification module being configured for:
memorization of a physical model of the electrical power transmission and/or distribution system with said current transmission line, the physical model describing fault parameters and behavior of travelling waves due to a fault in the electrical power transmission and/or distribution system and, in case of a fault, fault parameters comprising a fault-location parameter on said current transmission line ($L_{12}$, $L_{13}$, $L_{23}$) and a fault-impedance parameter,
measurement of voltage and/or current evolution at a specific location in said power system,
iterative simulation of the voltage and/or current evolution by the physical model at the measurement point with a set of fault parameters, wherein, at each iteration of said iterative simulation, simulated and measured voltage and/or current evolutions are compared and the set of fault parameters is adapted according to a convergence criterion,
identification of a fault and fault parameters thereof when convergence of the measured voltage and/or current evolutions and simulated voltage and/or current evolutions has been reached,
wherein the physical model is based on a telegraph equation for describing the fault parameters and the behavior of travelling waves due to the fault in said electrical power transmission and/or distribution system, and
wherein the only traveling waves are taken into account when iteratively simulating the voltage and/or current evolution are those that can reach the measurement point before a predetermined maximum time $t_{max}$ between one and ten milliseconds.

16. The apparatus according to claim 15, wherein the physical model is based on a telegraph equation for describing the fault parameters and the behavior of travelling waves due to the fault in said electrical power transmission and/or distribution system.

17. The apparatus according to claim 15, wherein the physical model is extended to take into account soil resistivity.

18. The apparatus of claim 15, further comprising a system that comprises said fault identification module for controlling at least one protection circuit said system in case of a fault identification, wherein said system is high or medium voltage electric power transmission and/or distribution system.

* * * * *